(12) United States Patent
Park et al.

(10) Patent No.: US 12,507,410 B2
(45) Date of Patent: Dec. 23, 2025

(54) SEMICONDUCTOR DEVICES

(71) Applicant: Samsung Electronics Co., Ltd., Suwon-si (KR)

(72) Inventors: Joowon Park, Seoul (KR); Woongseop Lee, Hwaseong-si (KR); Eiwhan Jung, Hwaseong-si (KR); Jisung Cheon, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 769 days.

(21) Appl. No.: 17/854,356

(22) Filed: Jun. 30, 2022

(65) Prior Publication Data

US 2022/0328522 A1 Oct. 13, 2022

Related U.S. Application Data

(63) Continuation of application No. 16/836,010, filed on Mar. 31, 2020, now Pat. No. 11,398,495.

(30) Foreign Application Priority Data

Aug. 20, 2019 (KR) .................. 10-2019-0101591

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5226* (2013.01); *H01L 23/528* (2013.01);
(Continued)

(58) Field of Classification Search
CPC ................................ H10B 43/27; H10B 43/20
See application file for complete search history.

(56) References Cited

U.S. PATENT DOCUMENTS

| 9,806,093 B2 | 10/2017 | Toyama et al. |
| 10,249,640 B2 | 4/2019 | Yu et al. |

(Continued)

FOREIGN PATENT DOCUMENTS

| CN | 106449648 A | 2/2017 |
| CN | 108377660 A | 8/2018 |

(Continued)

OTHER PUBLICATIONS

Office Action and English Translation corresponding to German Application No. 102020108092.1 issued Nov. 9, 2021 (18 pages).

(Continued)

*Primary Examiner* — Christopher A Johnson
(74) *Attorney, Agent, or Firm* — Wolf, Greenfield & Sacks, P.C.

(57) ABSTRACT

A semiconductor device includes a peripheral circuit region on a first substrate and including circuit devices, a memory cell region on a second substrate overlaid on the first substrate, with the memory cell region including gate electrodes stacked to be spaced apart from each other in a first direction perpendicular to an upper surface of the second substrate, and channel structures which extend vertically on the second substrate and penetrate through the gate electrodes. The channel structures may include a channel layer. The semiconductor device includes a through-wiring region with through-contact plugs that extend in the first direction and that electrically connect the memory cell region and the peripheral circuit region to each other, with the through-wiring region including an insulating region that surrounds the through-contact plugs. The through-wiring region further includes dummy channel structures regularly arranged throughout the through-wiring region and which include the channel layer.

15 Claims, 26 Drawing Sheets

(51) Int. Cl.
*H01L 23/528* (2006.01)
*H10B 41/10* (2023.01)
*H10B 41/27* (2023.01)
*H10B 41/40* (2023.01)
*H10B 41/50* (2023.01)
*H10B 43/10* (2023.01)
*H10B 43/40* (2023.01)
*H10B 43/50* (2023.01)

(52) U.S. Cl.
CPC ............ *H10B 41/10* (2023.02); *H10B 41/27* (2023.02); *H10B 41/40* (2023.02); *H10B 41/50* (2023.02); *H10B 43/10* (2023.02); *H10B 43/40* (2023.02); *H10B 43/50* (2023.02)

(56) References Cited

U.S. PATENT DOCUMENTS

| | | | |
|---|---|---|---|
| 10,256,248 | B2 | 4/2019 | Lu et al. |
| 10,269,620 | B2 | 4/2019 | Yu et al. |
| 2015/0371925 | A1 | 12/2015 | Thimmegowda et al. |
| 2017/0040337 | A1 | 2/2017 | Kim et al. |
| 2017/0179026 | A1 | 6/2017 | Toyama et al. |
| 2017/0179154 | A1* | 6/2017 | Furihata ............... H10D 89/911 |
| 2017/0373084 | A1 | 12/2017 | Shim et al. |
| 2018/0047744 | A1 | 2/2018 | Utsumi |
| 2018/0053768 | A1 | 2/2018 | Kim et al. |
| 2018/0114794 | A1 | 4/2018 | Jang et al. |
| 2018/0268902 | A1 | 9/2018 | Hiroyasu |
| 2018/0337192 | A1 | 11/2018 | Kim et al. |
| 2019/0043879 | A1 | 2/2019 | Lu et al. |
| 2019/0067321 | A1* | 2/2019 | Song ...................... H10B 43/27 |
| 2019/0198523 | A1 | 6/2019 | Nakanishi et al. |
| 2020/0119031 | A1 | 4/2020 | Shen et al. |
| 2021/0126005 | A1 | 4/2021 | Lu et al. |
| 2021/0257265 | A1 | 8/2021 | Kim |
| 2021/0408026 | A1 | 12/2021 | Shen et al. |

FOREIGN PATENT DOCUMENTS

| | | |
|---|---|---|
| CN | 109496356 A | 3/2019 |
| CN | 110114881 A | 8/2019 |
| JP | 2019117894 A | 7/2019 |
| KR | 10-2012-0136764 A | 12/2012 |
| KR | 20170018207 A | 2/2017 |
| WO | 2018161836 A1 | 9/2018 |

OTHER PUBLICATIONS

"Corrected Written Opinion corresponding to Singapore Application No. 10202003704X, Mailing date Sep. 15, 2023, 11 Pages", 11.

* cited by examiner

C

TB1

SEMICONDUCTOR DEVICES

CROSS-REFERENCE TO RELATED APPLICATIONS

This patent application is a continuation of U.S. patent application Ser. No. 16/836,010 filed Mar. 31, 2020, which claims the benefit under 35 USC § 119(a) of Korean Patent Application No. 10-2019-0101591 filed on Aug. 20, 2019, in the Korean Intellectual Property Office, and the entire disclosure of each above-identified application is incorporated herein by reference for all purposes.

BACKGROUND

The present inventive concept relates to semiconductor devices.

Semiconductor devices are becoming increasingly smaller and require increasing capacity to perform operations such as data processing. Accordingly, it is desirable to increase the degree of integration of semiconductor elements constituting such semiconductor devices. One proposed method for improving the degree of integration of a semiconductor device is to incorporate vertical transistor structures in lieu of related art planar transistor structures.

SUMMARY

Aspects of the present disclosure provide semiconductor devices having improved reliability.

According to an aspect of the present inventive concept, a semiconductor device includes a peripheral circuit region on a first substrate and including circuit devices, a memory cell region on a second substrate overlaid on the first substrate, wherein the memory cell region includes gate electrodes spaced apart from each other in a first direction that is perpendicular to an upper surface of the second substrate, with the memory cell region including channel structures that penetrate through the gate electrodes and that extend vertically on the second substrate, with the channel structures including a channel layer, and with a through-wiring region that electrically connects the memory cell region and the peripheral circuit region. The through-wiring region includes through-contact plugs that extend in the first direction and that penetrate through the memory cell region, and that electrically connect the memory cell region and the circuit devices, an insulating region that surrounds the through-contact plugs, with the insulating region including a first insulating layer in parallel to the second substrate and second insulating layers and third insulating layers alternately stacked on the first insulating layer, and with dummy channel structures that penetrate through the second insulating layers and the third insulating layers and that include the channel layer. The dummy channel structures are arranged in rows and columns such that at least one dummy channel structure is positioned between the through-contact plugs adjacent to each other.

According to an aspect of the present inventive concept, a semiconductor device includes a peripheral circuit region on a first substrate and including circuit devices, a memory cell region on a second substrate overlaid on the first substrate, the memory cell region includes a stacked structure comprising spaced-apart gate electrodes above the second substrate, and the memory cell region including channel structures that extend vertically to the second substrate and that penetrate through the gate electrodes. The channel structures may include a channel layer. The semiconductor device may include a through-wiring region including through-contact plugs that extend in the first direction and that electrically connect the memory cell region and the peripheral circuit region to each other, with the through-wiring region including an insulating region that surrounds the through-contact plugs. The through-wiring region further includes dummy channel structures regularly arranged throughout the through-wiring region and including the channel layer.

According to some aspects of the present inventive concept, a semiconductor device includes a first substrate, circuit devices on the first substrate, a second substrate on the circuit devices, gate electrodes spaced apart from each other in a first direction perpendicular to an upper surface of the second substrate, channel structures that penetrate through the gate electrodes and that extend vertically on the second substrate. The channel structures may include a channel layer. The semiconductor device may include separation regions that in a second direction perpendicular to the first direction and that penetrate the gate electrodes, with the separation regions being spaced apart from each other and in parallel to each other. The semiconductor device may include a through-wiring region located between adjacent separation regions and spaced apart from the adjacent separation regions, with the through-wiring region including through-contact plugs that electrically connect the circuit devices and the gate electrodes to each other, an insulating region surrounding the through-contact plugs, and dummy channel structures including the channel layer that are provided in at least the same number as a number of the through-contact plugs.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

Figure 1:
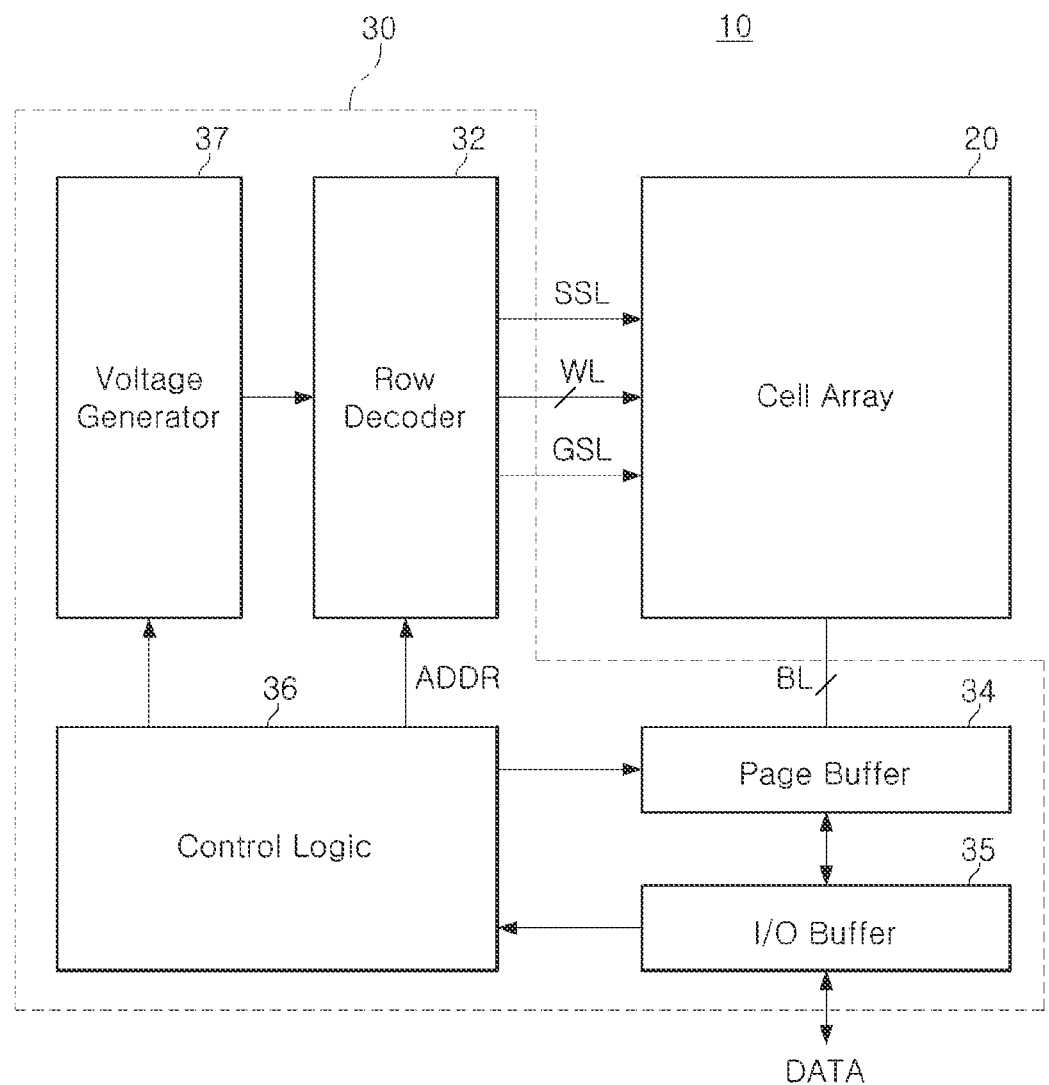
FIG. 1 is a schematic block diagram of a semiconductor device according to some example embodiments.

FIG. 1 is a schematic block diagram of a semiconductor device according to some example embodiments.

Referring to FIG. 1, a semiconductor device 10 may include a memory cell array 20 and a peripheral circuit 30. The peripheral circuit 30 may include a row decoder 32, a page buffer 34, an input/output buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, one or more word lines WL and a ground select line GSL, and may be connected to the page buffer 34 through one or more bit lines BL. In some example embodiments, the plurality of memory cells may be arranged in rows and columns. In some example embodiments, the plurality of memory cells arranged in the same row may be connected to the same word line WL, and the plurality of memory cells arranged in the same column may be connected to the same bit line BL.

The row decoder 32 may receive an input address ADDR from the control logic 36, and may decode the input address ADDR to generate and transmit driving signals of the word line WL. The row decoder 32 may provide respective word line voltages generated from the voltage generator 37 to a selected word line WL and unselected word lines WL in response to the control of the control logic 36.

The page buffer 34 may be connected to the memory cell array 20 through the bit lines BL to read information stored in the memory cells. The page buffer 34 may temporarily store data to be stored in the memory cells or may sense data stored in the memory cells, depending on an operation mode. The page buffer 34 may include a column decoder and a sense amplifier. The column decoder may selectively activate the bit lines BL of the memory cell array 20 responsive to signals received from the control logic 36, and the sense amplifier may sense a voltage of the bit line BL selected by the column decoder during a reading operation, to read data stored in the selected memory cell.

The input/output buffer 35 may receive data DATA during a programming operation to transfer the data to the page buffer 34, and may output the data received from the page buffer 34 during the reading operation externally. The input/output buffer 35 may transmit an input address or command to the control logic 36.

The control logic 36 may control the operation of the row decoder 32 and the page buffer 34. The control logic 36 may receive one or more control signals and an external voltage transmitted from a source outside of the semiconductor device 10, and may operate in response to the received one or more control signals. The control logic 36 may control reading, writing, and/or erasing operations of the semiconductor device 10 in response to the one or more control signals.

The voltage generator 37 may generate voltages required for internal operations, for example, a programming voltage, a reading voltage, an erasing voltage, and the like. These voltages may be generated from or by using an external voltage. The voltage generated by the voltage generator 37 may be transferred to the memory cell array 20 through the row decoder 32.

Figure 2:
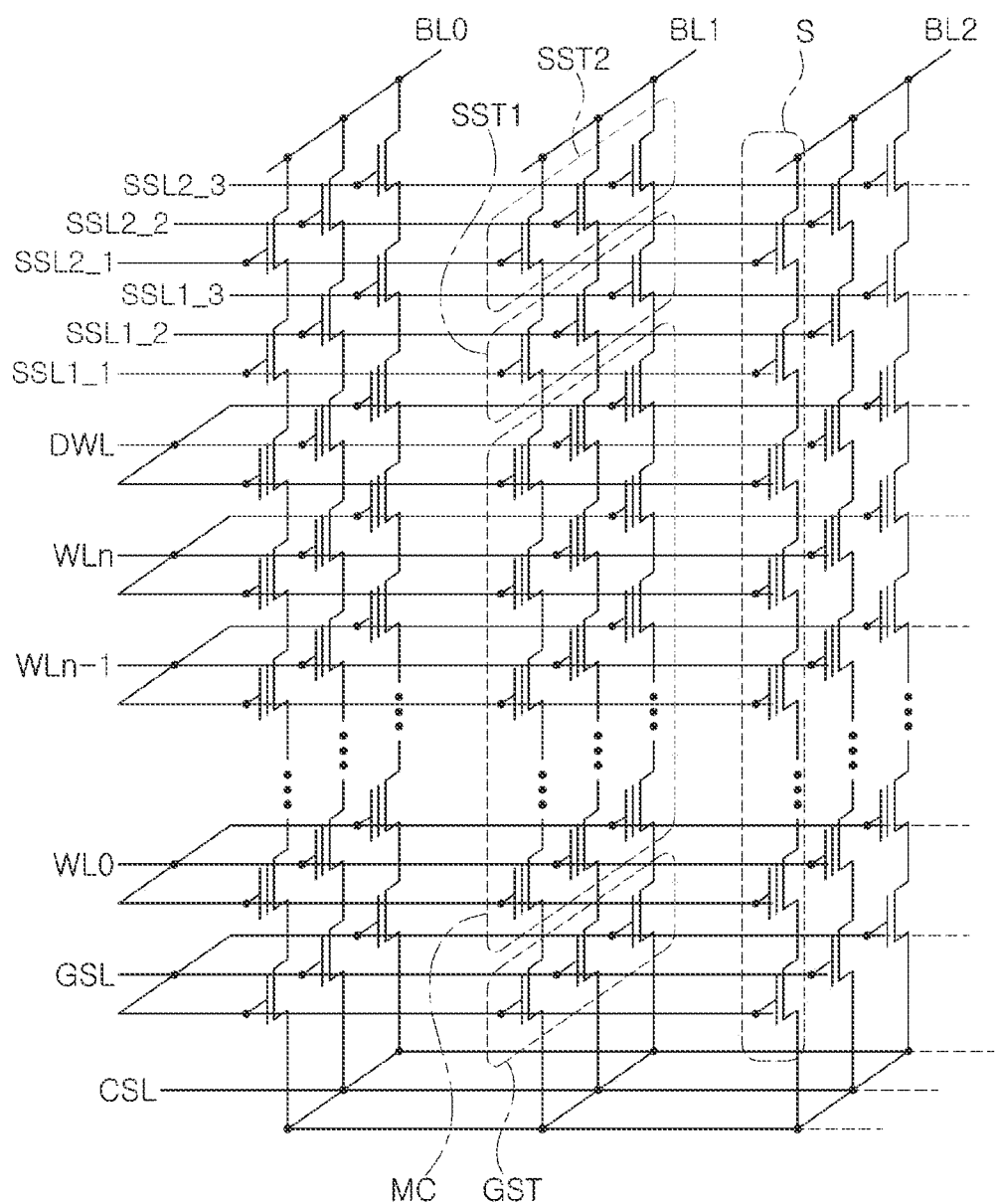
FIG. 2 is an equivalent circuit diagram of a cell array of a semiconductor device according to some example embodiments.

FIG. 2 is an equivalent circuit diagram of a cell array of a semiconductor device according to example embodiments.

Referring to FIG. 2, the memory cell array 20 may include a plurality of memory cell strings S. Each memory cell string S may include memory cells MC connected to each other in series, a ground select transistor GST at one end of the series of memory cells MC, and string select transistors SST1 and SST2 at the other end of the series of memory cells MC. Two or more of the plurality of memory cell strings S may be connected in parallel to a respective bit lines BL0 to BL2. The plurality of memory cell strings S may be commonly connected to a common source line CSL. For example, the plurality of memory cell strings S may be between the plurality of bit lines BL0 to BL2 and one common source line CSL. In some example embodiments, in the case of the common source line CSL, a plurality of common source lines may be arranged two-dimensionally.

The memory cells MC connected to each other in series may be controlled by word lines WL0 to WLn for selecting the memory cells MC. Each of the memory cells MC may include a data storage element. Gate electrodes of the memory cells MC which are substantially the same distance from the common source line CSL may be connected to one of the word lines WL0 to WLn in common to be in an equipotential state. Alternatively, although the gate electrodes of the memory cells MC may be substantially the same distance from the common source lines CSL, the gate electrodes in different rows or columns may be independently controlled.

The ground select transistor GST may be controlled by a ground select line GSL and may be connected to the common source line CSL. The string select transistors SST1 and SST2 may be controlled by string select lines SSL1_1, SSL1_2, SSL1_3, SSL2_1, SSL2_2 and SSL2_3, and may be connected to the bit lines BL0 to BL2. FIG. 2 illustrates a structure in which one ground select transistor GST and two string select transistors SST1 and SST2 are respectively connected to the plurality of memory cells MC connected to each other in series, but may also have a structure in which one string select transistor SST1, SST2 is respectively connected thereto, or a plurality of ground select transistors GST are connected thereto. One or more dummy lines DWL or buffer lines may be between an uppermost word line WLn from among the word lines WL0 to WLn, and the string select lines SSL1_1, SSL1_2, SSL1_3, SSL2_1, SSL2_2 and SSL2_3. In some example embodiments, one or more dummy lines DWL may also be between a lowermost word line WL0 and the ground select line GSL.

In some embodiments, when a signal is applied to the string select transistors SST1 and SST2 through the string select lines SSL1_1, SSL1_2, SSL1_3, SSL2_1, SSL2_2 and SSL2_3, the signal applied through the bit lines BL0 to BL2 is transmitted to the memory cells MC connected to each other in series, and thus, data reading and writing operations may be performed. In addition, by applying a predetermined erasing voltage through a substrate, an erasing operation of erasing data written to the memory cells MC may be executed. In some example embodiments, the memory cell array 20 may include at least one dummy memory cell string that is electrically isolated from the bit lines BL0 to BL2.

Figure 3:
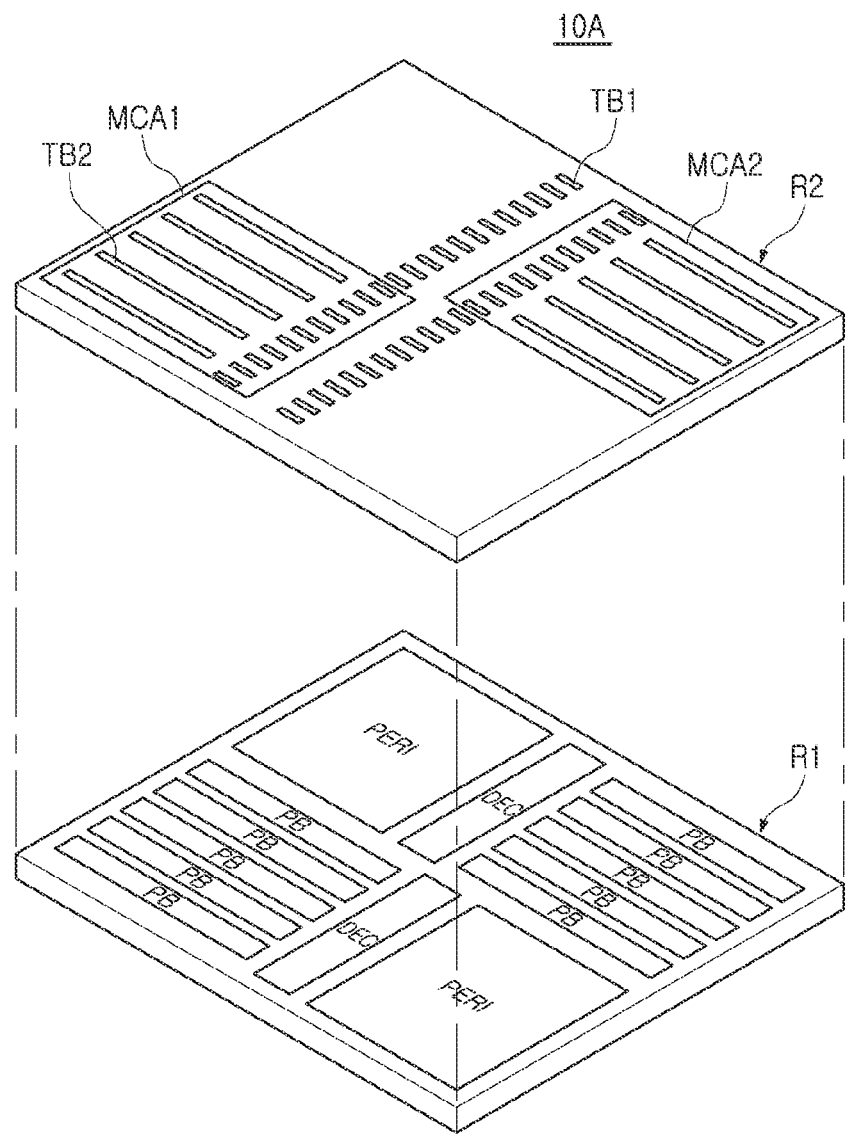
FIG. 3 is a schematic layout diagram illustrating an arrangement of a semiconductor device according to some example embodiments.

FIG. 3 is a schematic layout diagram illustrating an arrangement of a semiconductor device according to some example embodiments.

Referring to FIG. 3, a semiconductor device 10A may include first and second regions R1 and R2 stacked in a vertical direction. The first region R1 may include a peripheral circuit 30 of FIG. 1, and the second region R2 may include the memory cell array 20.

The first region R1 may include one or more row decoders DEC, one or more page buffers PB, and other peripheral circuits PERI. The second region R2 may include memory cell arrays MCA1 and MCA2 and first and second through-wiring regions TB1 and TB2.

In the first region R1, a row decoder DEC may correspond to the row decoder 32 described above with reference to FIG. 1, and a page buffer PB may correspond to an area corresponding to the page buffer 34. The other peripheral circuits PERI may include the control logic 36 and the voltage generator 37 of FIG. 1, and for example, may include a latch circuit, a cache circuit and/or a sense amplifier. The first region R1 may further include a separate pad region. For example, the pad region may be an area including the input/output buffer 35 of FIG. 1, and may include an electrostatic discharge (ESD) device or a data input/output circuit.

At least a portion of the various circuit areas DEC, PB and PERI in the first region R1 may be below the memory cell arrays MCA1 and MCA2 of the second region R2. For example, a page buffer PB may be arranged below the memory cell arrays MCA1 and MCA2 such that the memory cell arrays MCA1 and MCA2 overlaps the page buffer PB. In some embodiments, circuits included in the first region R1 and the arrangement thereof may be variously changed. Accordingly, circuits overlapped by the memory cell arrays MCA1 and MCA2 may also be variously changed.

In the second region R2, the memory cell arrays MCA1 and MCA2 may be arranged side by side, and may in some embodiments be spaced apart from each other. In some embodiments, the number and arrangement of the memory cell arrays MCA1 and MCA2 in the second region R2 may be changed variously. For example, the memory cell arrays MCA1 and MCA2 of the example embodiment shown in FIG. 3 may be disposed continuously and repeatedly.

The first and second through-wiring regions TB1 and TB2 may be regions including a wiring structure penetrating through the second region R2 and connected to the first region R1. The first through-wiring regions TB1 may be arranged on first sides of the memory cell arrays MCA1 and MCA2 and, for example, may include a wiring structure such as a contact plug or the like electrically connected to a row decoder DEC of the first region R1. The second through-wiring regions TB2 may be at a predetermined interval in the memory cell arrays MCA1 and MCA2, and for example, may include a wiring structure electrically connected to a page buffer PB of the first region R1. The number of the first through-wiring regions TB1 may be greater than the number of the second through-wiring regions TB2, and the shape, number, and positions of the first and second through-wiring regions TB1 and TB2 may be variously changed in various embodiments.

Figure 4:
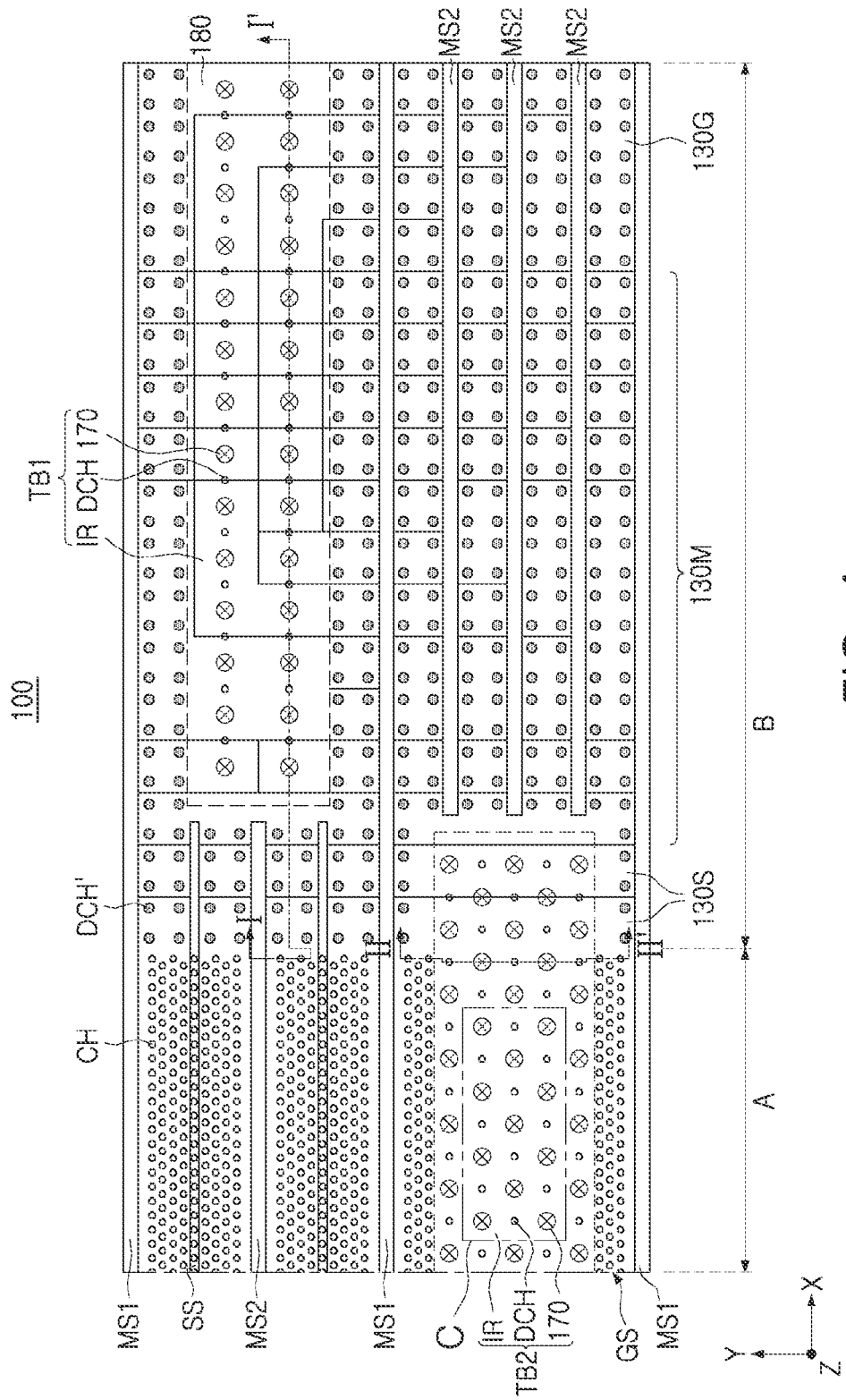
FIG. 4 is a schematic plan view of a semiconductor device according to some example embodiments.

FIG. 4 is a schematic plan view of a semiconductor device according to some example embodiments.

Figure 5A:
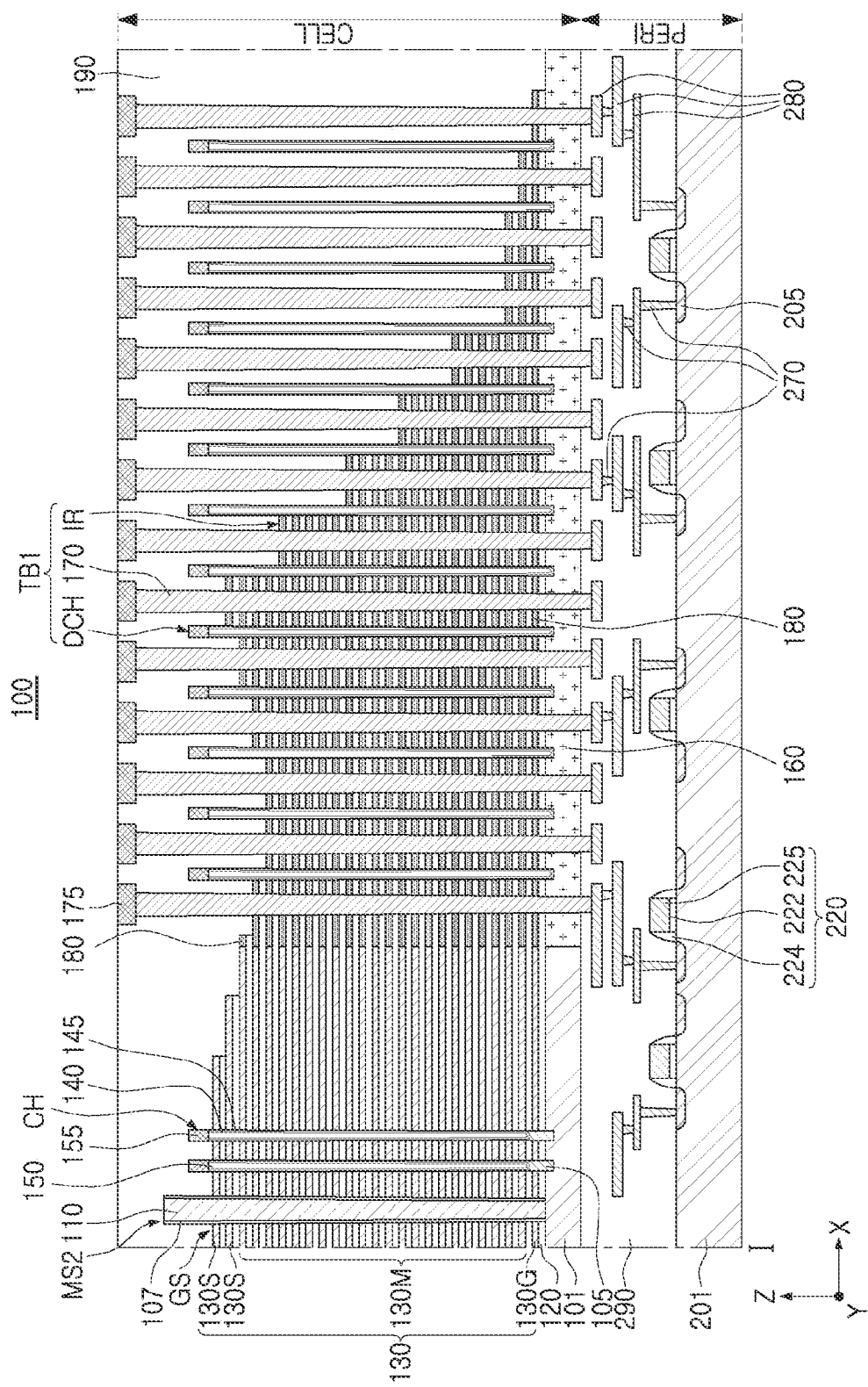
FIGS. 5A and 5B are schematic cross-sectional views of a semiconductor device according to some example embodiments.
Figure 5B:
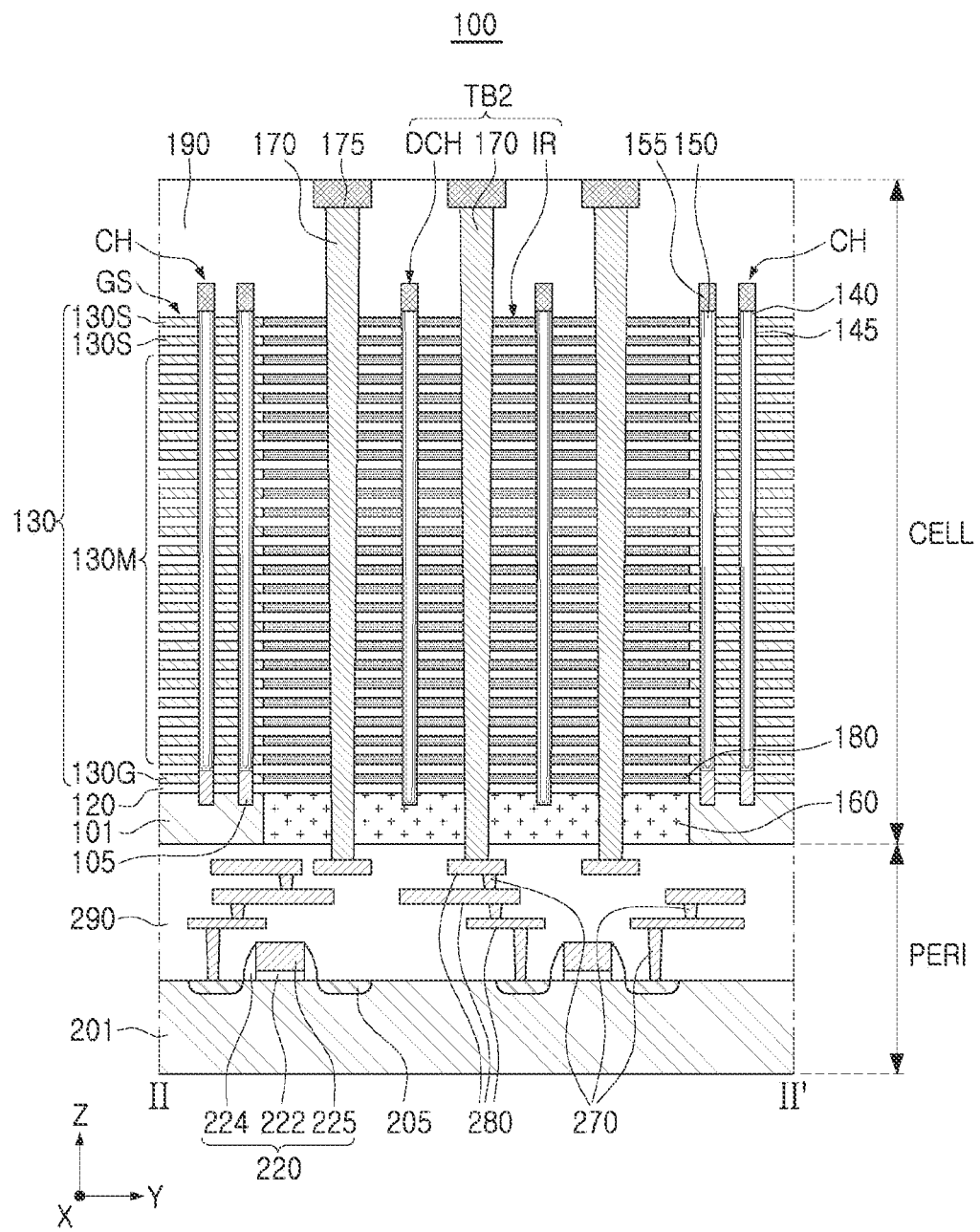

FIGS. 5A and 5B are schematic cross-sectional views of a semiconductor device according to some example embodiments. FIGS. 5A and 5B illustrate cross sections taken along lines I-I' and II-II' of FIG. 4, respectively.

Figure 6:
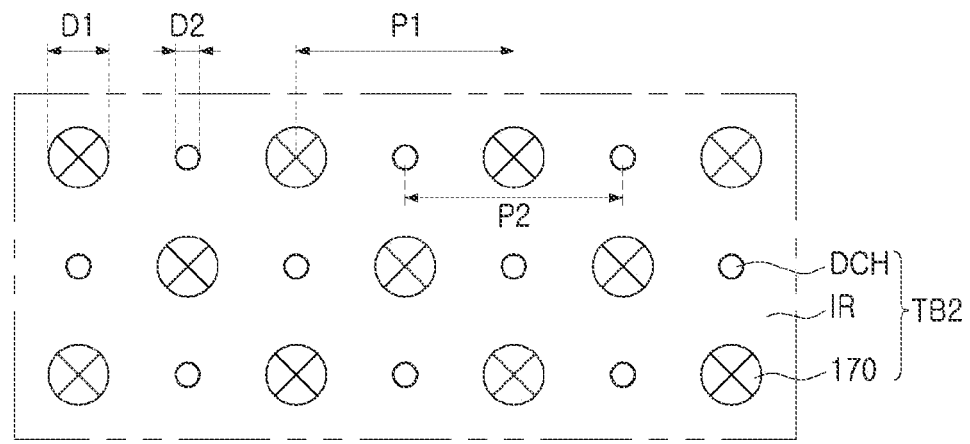
FIG. 6 is a schematic enlarged view illustrating a portion of a semiconductor device according to some example embodiments.

FIG. 6 is a schematic enlarged partial view of a semiconductor device according to some example embodiments, and is an enlarged view illustrating region 'C' of FIG. 4.

Referring to FIGS. 4 to 6, a semiconductor device 100 may include a memory cell region CELL and a peripheral circuit region PERI. The memory cell region CELL may be on the peripheral circuit region PERI. In some example embodiments, the cell region CELL may be below the peripheral circuit region PERI.

The memory cell region CELL may include a substrate 101 having a first region A and a second region B, a stacked structure GS of gate electrodes 130 stacked on the substrate 101, first and second separation regions MS1 and MS2 extending in a first direction (a "X" direction) and penetrating into the stacked structure GS of the gate electrodes 130 in a third direction (a "Z" direction), upper separation regions SS penetrating through a portion of the stacked structure GS, channel structures CH penetrating through the stacked structure GS, and first and second through-wiring regions TB1 and TB2 penetrating through the stacked structure GS and the substrate 101 and connected to the peripheral circuit region PERI. The memory cell region CELL may further include interlayer insulating layers 120 alternately stacked with the gate electrodes 130 on the substrate 101, wiring lines 175, and a cell region insulating layer 190.

The first region A of the substrate 101 is an area in which the gate electrodes 130 are vertically stacked and the channel structures CH are arranged, and may be an area corresponding to the memory cell array 20 of FIG. 1 and the memory cell arrays MCA1 and MCA2 of FIG. 3. The second region B is an area in which the gate electrodes 130 extend by different lengths, and may be an area that includes electrical connections between the memory cell array 20 and the peripheral circuit 30 of FIG. 1. The second region B may be on at least one end of the first region A in at least one direction, for example, the X direction.

The substrate 101 may have an upper surface extending in the X direction and in a second direction (a "Y") direction. The substrate 101 may include a semiconductor material, such as a group IV semiconductor, a group III-V compound semiconductor, or a group II-VI compound semiconductor. For example, the group IV semiconductor may include silicon, germanium or silicon-germanium. The substrate 101 may be provided as a bulk wafer or an epitaxial layer.

The gate electrodes 130 may be stacked so as to be spaced apart on the substrate 101 in a vertical direction to form a stacked structure GS. As best seen in FIGS. 5A and 5B, the stacked structure GS may include a lower gate electrode 130G that forms a gate of the ground select transistor GST of FIG. 2, a plurality of memory gate electrodes 130M that form the plurality of memory cells MC, and upper gate electrodes 130S that form gates of the string select transistors SST1 and SST2. The number of memory gate electrodes 130M constituting the memory cells MC may be determined depending on the capacity of the semiconductor device 100. According to some example embodiments, the number of upper and lower gate electrodes 130S and 130G of the string select transistors SST1 and SST2 and the ground select transistor GST may be one, or two or more, respectively, and may have the same structure as or a structure different from that of the gate electrodes 130 of the memory cells MC. Portions of the gate electrodes 130, for example, memory gate electrodes 130M adjacent to the upper or lower gate electrodes 130S and 130G, may be dummy gate electrodes.

The gate electrodes 130 may be stacked to be vertically spaced apart from each other on the first region A, and may extend by different lengths from the first region A to the second region B to form a stepped step. The gate electrodes 130 may form the same step as that of sacrificial insulating layers 180 illustrated in FIG. 5A in the X direction, and may also form a step in the Y direction. By the step portion, the gate electrodes 130 may provide pad regions exposed upwardly, as a first gate electrode 130 may extend further than a second gate electrode 130 above the first, or a farther distance from the upper surface of the substrate 101. The gate electrodes 130 may be connected to separate contact plugs in the pad regions to be connected to upper wiring lines 175. Except for the upper and lower gate electrodes 130S and 130G among the gate electrodes 130, at least portions of the memory gate electrodes 130M may form stacks. For example, memory gate electrodes 130M of a predetermined number, for example, four memory gate electrodes 130M may form a single stack, and a step may be formed between the stacks. Four memory gate electrodes 130M constituting the single stack may be disposed to have a step in the Y direction.

As illustrated in FIG. 4, the gate electrodes 130 may be separated from each other in the Y direction by the first separation region MS1 extending in the X direction. The gate electrodes 130 between one pair of first separation regions MS1 may form a single memory block, but the range of the memory block is not limited thereto. Portions of the gate electrodes 130, for example, each of the memory gate electrodes 130M may form a single layer in one memory block.

The gate electrodes 130 may include a metal material, such as tungsten (W). According to some example embodiments, the gate electrodes 130 may include polycrystalline silicon or a metal silicide material. In some example embodiments, the gate electrodes 130 may further include a diffusion barrier, and for example, the diffusion barrier may include tungsten nitride (WN), tantalum nitride (TaN), titanium nitride (TiN), or combinations thereof.

The interlayer insulating layers 120 may be between the gate electrodes 130. Like the gate electrodes 130, the interlayer insulating layers 120 may be spaced apart from each other in a direction perpendicular to an upper surface of the substrate 101 and to extend in the X direction. The interlayer insulating layers 120 may include an insulating material such as silicon oxide or silicon nitride.

The first and second separation regions MS1 and MS2 may extend in the X direction while penetrating in the Z direction into the gate electrodes 130 in the first region A and in the second region B. The first and second separation regions MS1 and MS2 may be parallel to each other. The first and second separation regions MS1 and MS2 may be connected to the substrate 101 by penetrating through the entire gate electrodes 130 stacked on the substrate 101. The first separation regions MS1 may extend across the first region A and across the second region B, and the second separation regions MS2 may extend only partially across the first region A and/or the second region B. The first and second separation regions MS1 and MS2 may not overlap with the first and second through-wiring regions TB1 and TB2, and may be spaced apart from the first and second through-wiring regions TB1 and TB2. However, in some example embodiments, the arrangement order, number, and the like of the first and second separation regions MS1 and MS2 are not limited to those illustrated in FIG. 4.

As illustrated in FIG. 5A, an isolation insulating layer 107 and a conductive layer 110 that is insulated from the gate electrodes 130 by the isolation insulating layer 107 may be on at least portions of the first and second separation regions MS1 and MS2. The conductive layer 110 may have a shape in which a width thereof decreases toward the substrate 101 due to a relatively high aspect ratio, but the present disclosure is not limited thereto. For example, the conductive layer 110 may have a side surface perpendicular to the upper surface of the substrate 101. In some example embodiments, an impurity region may be disposed on the substrate 101 in contact with the conductive layer 110.

In some example embodiments, the conductive layer 110 may be on both the first and second separation regions MS1 and MS2. As such, the conductive layers 110 of the first separation regions MS1 may correspond to the common source line CSL described with reference to FIG. 2, and the conductive layers 110 of the second separation regions MS2 may correspond to a dummy common source line. Therefore, the conductive layer 110 forming the second separation regions MS2 may be in a floating state in which the conductive layer 110 is not connected to the elements driving the semiconductor device 100, and/or an electrical signal may not be applied thereto. In some example embodiments, the conductive layer 110 may be omitted. As such, in some example embodiments, the common source line CSL may be formed as a doped layer in the substrate 101 or a conductive layer on the substrate 101, and the first and second separation regions MS1 and MS2 may only be filled with an insulating material.

The upper separation regions SS may extend in the X direction, between the first separation regions MS1 and the second separation region MS2. In regions of the semiconductor device 100 in which the first and second through-wiring regions TB1 and TB2 are absent, the upper separation regions SS may be in parallel with a portion of the second separation region MS2. The upper separation regions SS may be in a portion of the second region B and in the first region A, to penetrate through a portion of the gate electrodes 130, including uppermost gate electrodes 130S among the gate electrodes 130. The upper separation regions SS may separate a total of three gate electrodes 130 that include upper gate electrodes 130S, from each other, in the Y direction. However, the present disclosure is not limited thereto, and the number of gate electrodes 130 separated by the upper separation regions SS may variously vary in example embodiments. The upper gate electrodes 130S separated by the upper separation regions SS may form different string select lines SSL1_1, SSL1_2, SSL1_3, SSL2_1, SSL2_2, and SSL2_3 (see FIG. 2). The upper separation regions SS may include an insulating layer.

In some example embodiments, the semiconductor device 100 may further include insulating layers separating the lower gate electrodes 130G among the gate electrodes 130. For example, in a region in which the second separation regions MS2 are spaced apart from each other linearly in the X direction, the insulating layer may be between the second separation regions MS2 to separate the lower gate electrodes 130G from each other.

Each of the channel structures CH may form one memory cell string S (see FIG. 2), and may be spaced apart from each other in rows and columns on the first region A. The channel structures CH may form a grid, or may be in a zigzag form in one direction. The channel structures CH may have a columnar shape and may have an inclined side according to an aspect ratio. In some example embodiments, the channel structures CH on the end of the first region A adjacent to the second region B, and the channel structures CH adjacent to the first and second through-wiring regions TB1 and TB2 may be dummy channels that do not substantially constitute a memory cell string. In addition, pad channel structures DCH' having the same structure as the channel structures CH may be in pad regions of the gate electrodes 130. The pad channel structures DCH' may have the same as or a larger size than the channel structures CH. For example, four pad channel structures DCH' may be provided per pad area, but the present disclosure is not limited thereto.

A channel layer 140 may be provided in the channel structures CH. In the channel structures CH, the channel layer 140 may be formed to have an annular shape surrounding a channel insulating layer 150 therein, but according to some example embodiments, the channel layer 140 may have a cylindrical or prismatic shape without the channel insulating layer 150. A lower portion of the channel layer 140 may be connected to an epitaxial layer 105. The channel layer 140 may include a semiconductor material such as polycrystalline silicon or single crystal silicon, and the semiconductor material may be an undoped material or a material including p-type or n-type impurities. The channel structures CH may be arranged in a straight line in the Y direction, between the first or second separation regions MS1 and MS2 and the upper separation region SS, and may be connected to different bit lines BL0 to BL2 (see FIG. 2), respectively, depending on the arrangement of an upper wiring structure connected to channel pads 155.

The channel pads 155 may be on the channel layer 140 in the channel structures CH. The channel pads 155 may to cover an upper surface of the channel insulating layer 150 and to be electrically connected to the channel layer 140. The channel pads 155 may include, for example, doped polycrystalline silicon.

A gate dielectric layer 145 may be between the gate electrodes 130 and the channel layer 140. Although not specifically illustrated, the gate dielectric layer 145 may include a tunneling layer, a charge storage layer, and a blocking layer sequentially stacked from the channel layer 140. The tunneling layer may tunnel charges into the charge storage layer, and may include, for example, silicon oxide (SiO2), silicon nitride (Si3N4), silicon oxynitride (SiON), or combinations thereof. The charge storage layer may be a charge trapping layer or a floating gate conductive layer. The blocking layer may include silicon oxide (SiO2), silicon nitride (Si3N4), silicon oxynitride (SiON), a high-k dielectric material, or combinations thereof. In some example embodiments, at least a portion of the gate dielectric layer 145 may extend in the horizontal direction along the gate electrodes 130.

The epitaxial layer 105 may be provided on a lower end of the channel structures CH, to be on the substrate 101, and may be on the side of at least one gate electrode 130. The epitaxial layer 105 may be in a recessed region of the substrate 101. The height of an upper surface of the epitaxial layer 105 may be higher than an upper surface of a lowermost gate electrode 130, and may be lower than a lower surface of the gate electrode 130 on the lowermost gate electrode 130, but the present disclosure is not limited thereto. In some example embodiments, the epitaxial layer 105 may be omitted, and in these embodiments, the channel layer 140 may be directly connected to the substrate 101 or may be connected to another conductive layer on the substrate 101.

The first and second through-wiring regions TB1 and TB2 may be regions including a wiring structure for electrically connecting the memory cell region CELL and the peripheral circuit region PERI to each other. The first and second through-wiring regions TB1 and TB2 may include through-contact plugs 170 extending in the Z direction to penetrate into the stacked structure GS of the gate electrodes 130 and the substrate 101, an insulating region IR surrounding the through-contact plugs 170 and dummy channel structures DCH that penetrate through a portion of the insulating region IR. The first through-wiring region TB1 may be in the second region B, and for example, one first through-wiring region TB1 may be provided per one or more memory blocks. The second through-wiring region TB2 may be in the first region A, and one second through-wiring region TB2 may be provided per plurality of memory blocks. However, the number, size, arrangement, form, and shape of the first and second through-wiring regions TB1 and TB2 illustrated in FIG. 4 may be variously changed in example embodiments.

The first and second through-wiring regions TB1 and TB2 may be spaced apart from the first and second separation regions MS1 and MS2. For example, the first and second through-wiring regions TB1 and TB2 may be provided centrally between adjacent first and second separation regions MS1 and MS2 in the Y direction, so as to be spaced apart from the adjacent first and second separation regions MS1 and MS2. By such an arrangement, the insulating region IR of the first and second through-wiring regions TB1 and TB2 may be formed, which will be described in more detail with reference to FIG. 13C below.

The insulating region IR may be a region formed of an insulating material, and the gate electrode 130 may be absent therefrom. The insulating region IR may include a substrate insulating layer 160, which may be a first insulating layer in parallel to the substrate 101 at the same level as the substrate 101, and may include interlayer insulating layers 120 and sacrificial insulating layers 180, which may be second and third insulating layers alternately stacked on the upper surface of the substrate 101.

The substrate insulating layer 160 may be in a region from which a portion of the substrate 101 is removed. The substrate insulating layer 160 may be surrounded by the substrate 101. The substrate insulating layer 160 may have an upper surface that is substantially coplanar with the upper surface of the substrate 101, and a lower surface of the substrate insulating layer 160 may be coplanar with a lower surface of the substrate 101 or may be disposed on a lower level than the lower surface of the substrate 101. The interlayer insulating layers 120 may form the insulating region IR in the first and second through-wiring regions TB1 and TB2 while forming the stacked structure GS with the gate electrodes 130. The sacrificial insulating layers 180 may be positioned on the same level as the gate electrodes 130 and in such a manner that sides thereof are in contact with the gate electrodes 130 at boundaries of the first and second through-wiring regions TB1 and TB2.

The substrate insulating layer 160, the interlayer insulating layers 120, and the sacrificial insulating layers 180, forming the insulating region IR, may be formed of an insulating material. For example, the substrate insulating layer 160, the interlayer insulating layers 120, and the sacrificial insulating layers 180 may each include silicon oxide, silicon nitride, or silicon oxynitride. In some example embodiments, even in the case in which portions of the substrate insulating layer 160, the interlayer insulating layers 120, and the sacrificial insulating layers 180 are formed of the same material, physical properties may vary depending on a forming process, a composition, and the like, and thus, the boundaries thereof may be distinguished from each other. The substrate insulating layer 160 and the sacrificial insulating layers 180 may have the same or different widths.

The through-contact plugs 170 may extend perpendicularly to the upper surface of the substrate 101, may penetrate through the insulating region IR, and may electrically connect the memory cell region CELL and circuit devices 220 of the peripheral circuit region PERI. For example, the through-contact plugs 170 may electrically connect the gate electrodes 130 and the channel structures CH of the memory cell region CELL and the circuit devices 220 of the peripheral circuit region PERI. However, the wiring structure for electrically connecting the memory cell region CELL and the circuit devices 220 of the peripheral circuit region PERI is not limited to the through-contact plugs 170 in the first and second through-wiring regions TB1 and TB2. For example, an additional wiring structure may be in an outer region of the second region B or the like. Upper portions of the through-contact plugs 170 may be connected to wiring lines 175, but may also be connected to separate contact plugs according to example embodiments. Lower portions of the through-contact plugs 170 may be connected to circuit wiring lines 280.

The through-contact plugs 170 may penetrate through the sacrificial insulating layers 180 and the interlayer insulating layers 120 of the insulating region IR, and may penetrate through the substrate insulating layer 160 on the bottom thereof. The number, form, and shape of the through-contact plugs 170 arranged in one insulating region IR may vary variously in example embodiments. In some example embodiments, the through-contact plugs 170 may have a form in which a plurality of plugs are connected. According to some example embodiments, in addition to the through-contact plugs 170, wiring structures in the form of wiring lines may be further disposed in the insulating region IR. The through-contact plugs 170 may include a conductive material. For example, the through-contact plugs 170 may include tungsten (W), copper (Cu), aluminum (Al), or the like.

The dummy channel structures DCH may be regularly arranged between the through-contact plugs 170 in the first and second through-wiring regions TB1 and TB2. The arrangement of the dummy channel structures DCH is not limited to a specific region in the respective first and second through-wiring regions TB1 and TB2, and may be regularly and evenly arranged throughout the first and second through-wiring regions TB1 and TB2. As illustrated in FIG. 4, the dummy channel structures DCH may be arranged in rows and columns such that at least one or more of the dummy channel structures DCH may be positioned between two adjacent through-contact plugs 170. In greater detail, the dummy channel structure DCH may be centrally between two adjacent through-contact plugs 170 in the X direction, and centrally between two adjacent through-contact plugs 170 in the Y direction. In this case, the dummy channel structures DCH may be provided without degrading the electrical function of the through-contact plugs 170.

In some example embodiments, the dummy channel structures DCH may be arranged in substantially the same pattern as the through-contact plugs 170. The dummy channel structures DCH may be arranged at the same or higher density than the through-contact plugs 170, for example, in the same number per unit area. For example, when the size of the dummy channel structure DCH is relatively small, the dummy channel structures DCH may be arranged at a higher density than the through-contact plugs 170. The dummy channel structures DCH may be arranged in a different pattern from that of the channel structures CH, and may be arranged at a relatively low density. Alternatively, the dummy channel structures DCH may also be arranged in the same pattern and the same density as the channel structures CH. In this case, the dummy channel structure DCH may be arranged in a continuous pattern from the channel structures CH. The dummy channel structure DCH may not be electrically connected to upper wiring structures and/or may not form the memory cell string S (see FIG. 2), differing from the channel structures CH in the semiconductor device 100.

As illustrated in the enlarged view of FIG. 6, the through-contact plug 170 may have a first maximum diameter D1, and the dummy channel structure DCH may have a second maximum diameter D2 smaller than the first maximum diameter D1. In some embodiments, the first maximum diameter D1 may range from about 250 nm to about 350 nm, and the second maximum diameter D2 may range from about 70 nm to about 130 nm. The second maximum diameter D2 may be equal to or less than a maximum diameter of the channel structures CH, but the present disclosure is not limited thereto. When the dummy channel structures DCH have a diameter less than the maximum diameter of the channel structures CH, the dummy channel structures DCH may be spaced apart from the through-contact plugs 170. The through-contact plugs 170 may be arranged at a first pitch P1, the dummy channel structures DCH may be arranged at a second pitch P2. The second pitch P2 may be equal to the first pitch P1, but the present disclosure is not limited thereto. As used herein, "pitch" refers to a length from center to center or a length from one end to one end with respect to one configuration.

At least a portion of the dummy channel structures DCH may have a structure corresponding to the channel structures CH. For example, the dummy channel structures DCH may include the same configuration as that of the channel structures CH, in a position corresponding to the position of the channel structures CH. The channel layer 140 may be in the dummy channel structures DCH, and in addition to the channel layer 140, the dummy channel structures DCH may include a gate dielectric layer 145, a channel insulating layer 150, and a channel pad 155. The epitaxial layer 105 may be absent from the dummy channel structures DCH. In some example embodiments, in the case in which the channel structures CH have a structure in which the epitaxial layer 105 is absent, the dummy channel structures DCH may have the same structure as the channel structures CH.

The arrangement of the dummy channel structures DCH and the through-contact plugs 170 may be the same as or different from each other in the first through-wiring region TB1 and the second through-wiring region TB2. For example, as illustrated in FIG. 4, the dummy channel structure DCH and the through-contact plugs 170 may have different patterns and densities in the first through-wiring region TB1 and the second through-wiring region TB2. Since the dummy channel structures DCH are in the first and second through-wiring regions TB1 and TB2, the continuity of the arrangement of the channel structures CH may be ensured in the first region A, and the continuity of the arrangement of the pad channel structures DCH' may be ensured in the second region B. Therefore, the channel structures CH and the pad channel structures DCH' may be formed to have a uniform size and shape even in regions adjacent to the first and second through-wiring regions TB1 and TB2.

The wiring line 175 may configure a wiring structure electrically connected to the memory cells in the memory cell region CELL. The wiring line 175 may be electrically connected to the gate electrodes 130 or the channel structures CH, for example. The number of wiring lines and contact plug constituting the wiring structure may vary in various embodiments. The wiring line 175 may include a metal, and may include, for example, tungsten (W), copper (Cu), aluminum (Al), or the like.

The cell region insulating layer 190 may cover the substrate 101, the gate electrodes 130 on the substrate 101, and a peripheral region insulating layer 290. The cell region insulating layer 190 may be formed of an insulating material.

The peripheral circuit region PERI may include a base substrate 201, circuit devices 220 on the base substrate 201, circuit contact plugs 270, and circuit wiring lines 280.

The base substrate 201 may have an upper surface extending in the X direction and the Y direction. In the base substrate 201, separate device isolation layers may be formed to define an active region. Source/drain regions 205 including impurities may be in a portion of the active region. The base substrate 201 may include a semiconductor material, such as a group IV semiconductor, a group III-V compound semiconductor, or a group II-VI compound semiconductor.

The circuit devices 220 may include planar transistors. Each of the circuit devices 220 may include a circuit gate dielectric layer 222, a spacer layer 224, and a circuit gate electrode 225. The source/drain regions 205 may be disposed on both sides of the circuit gate electrode 225 in the base substrate 201.

The peripheral region insulating layer 290 may be on the circuit device 220 on the base substrate 201. The circuit contact plugs 270 may penetrate through the peripheral region insulating layer 290, and may be connected to the source/drain regions 205. Electrical signals may be applied to the circuit device 220 by the circuit contact plugs 270. In an area not illustrated, the circuit contact plugs 270 may also be connected to the circuit gate electrode 225. The circuit wiring lines 280 may be connected to the circuit contact plugs 270 and may be in a plurality of layers.

Figure 7A:
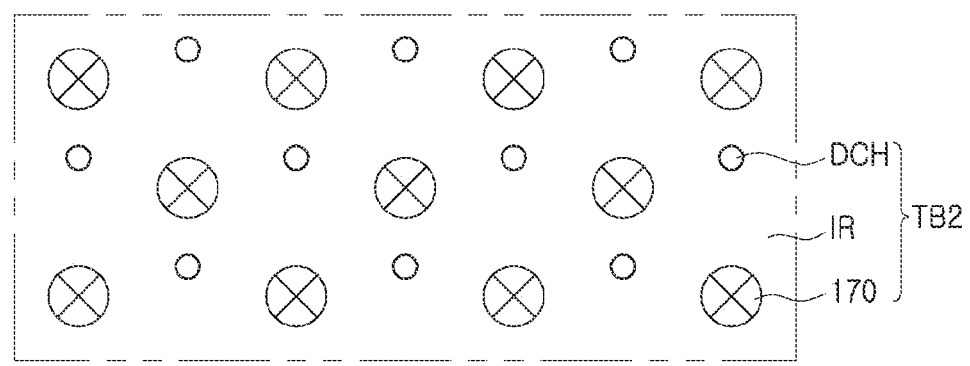
FIGS. 7A to 7C are plan views of a semiconductor device according to some example embodiments.
Figure 7B:
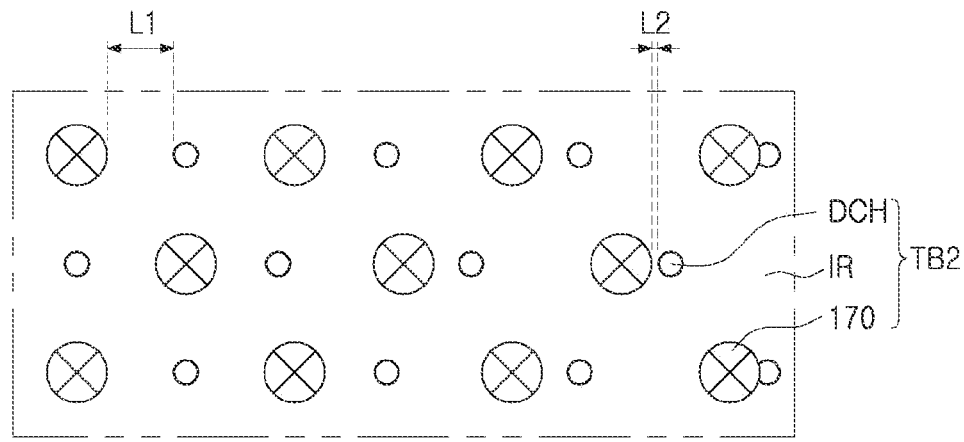
Figure 7C:
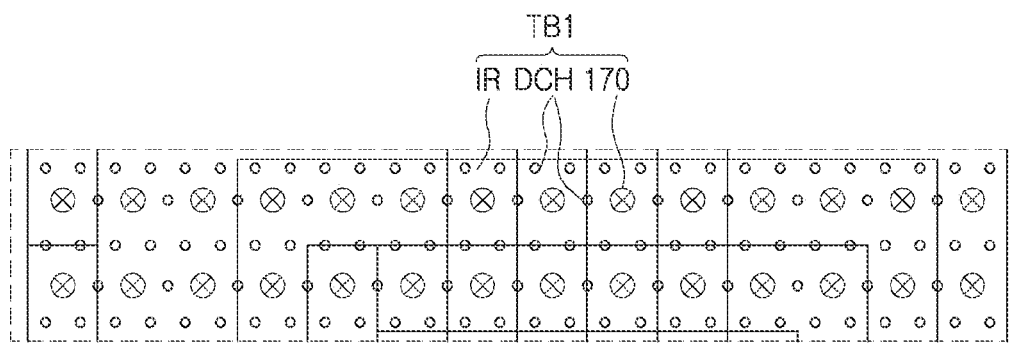

FIGS. 7A to 7C are plan views of semiconductor devices according to example embodiments. FIGS. 7A and 7B illustrate an enlarged area corresponding to area 'C' of FIG. 4, and FIG. 7C illustrates an area corresponding to 'TB1' of FIG. 4.

Referring to FIG. 7A, in some example embodiments, in the second through-wiring region TB2, the through-contact plugs 170 and the dummy channel structures DCH may be arranged in a different pattern from that in the example embodiments described with reference to FIGS. 4 and 6. For example, the dummy channel structure DCH may be on one side of each through-contact plug 170 in the Y direction, rather than being centered between two adjacent through-contact plugs 170 in the X direction and two adjacent through-contact plugs 170 in the Y direction. As such, in some example embodiments, the pattern in which the dummy channel structures DCH are arranged may be variously changed.

Referring to FIG. 7B, in some example embodiments, in the second through-wiring region TB2, the dummy channel structures DCH may have different separation distances from the through-contact plug 170 in one direction, different from the example embodiments described with reference to FIGS. 4 and 6. In greater detail, the second through-wiring region TB2 may include, a dummy channel structure (DCH) of which a separation distance from the through-contact plug 170 is a first length L1, and a dummy channel structure DCH of which a separation distance from the through-contact plug 170 is a second length L2 less than the first length L1. In addition, at least one dummy channel structure DCH may be disposed to overlap the through-contact plug 170. In this case, since the dummy channel structure DCH is formed first and then the through-contact plug 170 is formed, the through-contact plug 170 may be formed to penetrate through the dummy channel structure DCH. Such a structure may be formed in the semiconductor device 100 in instances where mis-alignment occurs due to a difference in pattern density, a process error, or the like. However, even in such instances, since the dummy channel structures DCH and the through-contact plugs 170 are surrounded by the insulating region IR, deterioration of electrical characteristics may be avoided or lessened.

Referring to FIG. 7C, in the first through-wiring region TB1, the dummy channel structures DCH may be provided in a greater number than in the example embodiment of FIG. 4. For example, the dummy channel structure DCH may be arranged in rows on the outside of the contact plugs 170 in the Y direction and between the contact plugs 170 in the Y direction, as well as between two adjacent through-contact plugs 170 in the X direction. The dummy channel structure DCH additionally may be arranged in a zigzag form with the contact plugs 170.

In FIG. 7C, the dummy channel structures DCH are illustrated as being further arranged in three rows along the X direction, but the number of additional rows of the dummy channel structures DCH is not limited to the illustration in the drawing. For example, in some embodiments, the row of dummy channel structures DCH between the contact plugs 170 in the Y direction may be omitted. As such, in example embodiments, the arrangement, form, and pattern of the dummy channel structures DCH in the first through-wiring region TB1 may be variously changed.

Figure 8:
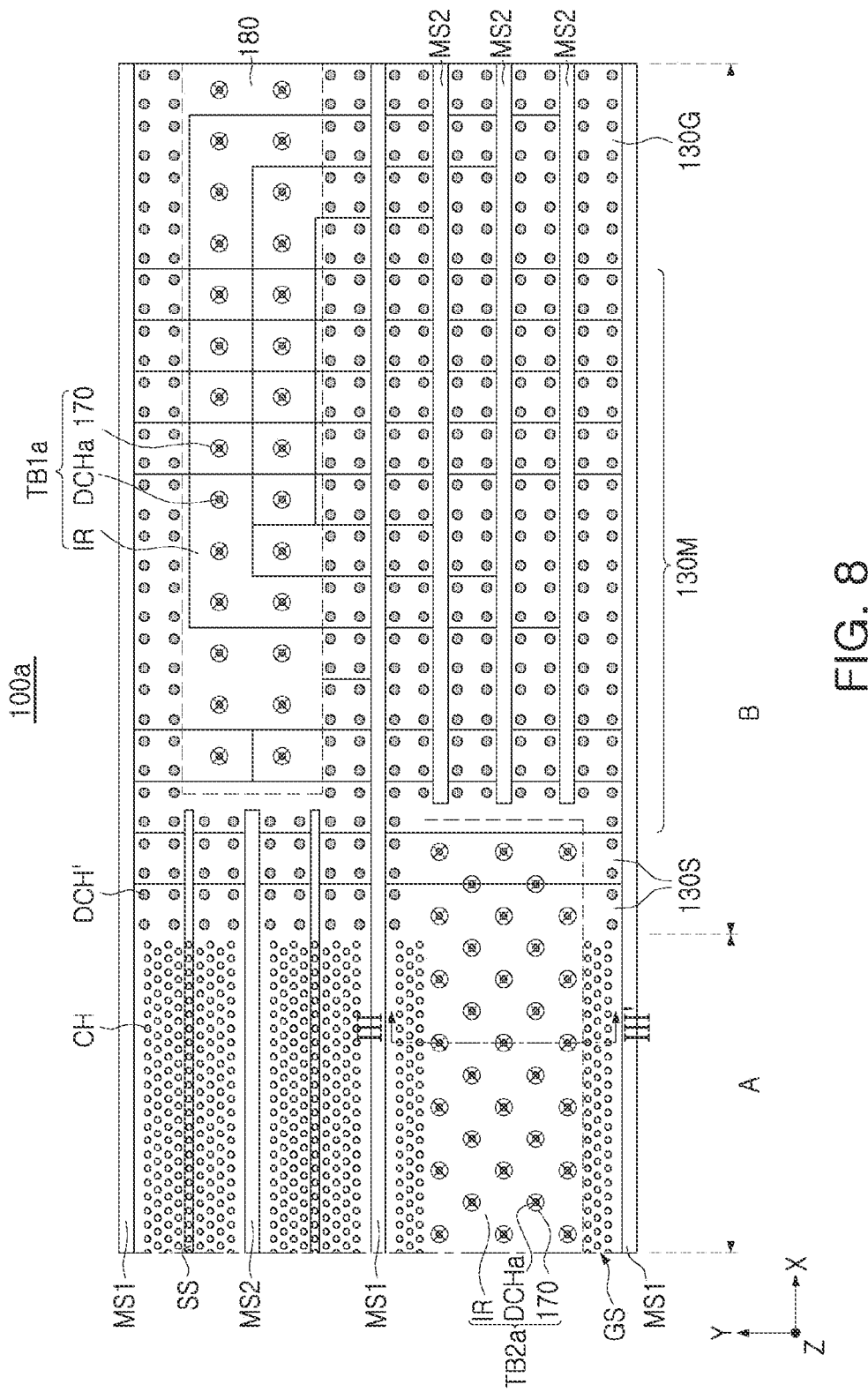
FIGS. 8 and 9 are a schematic plan view and cross-sectional view of a semiconductor device according to some example embodiments.
Figure 9:
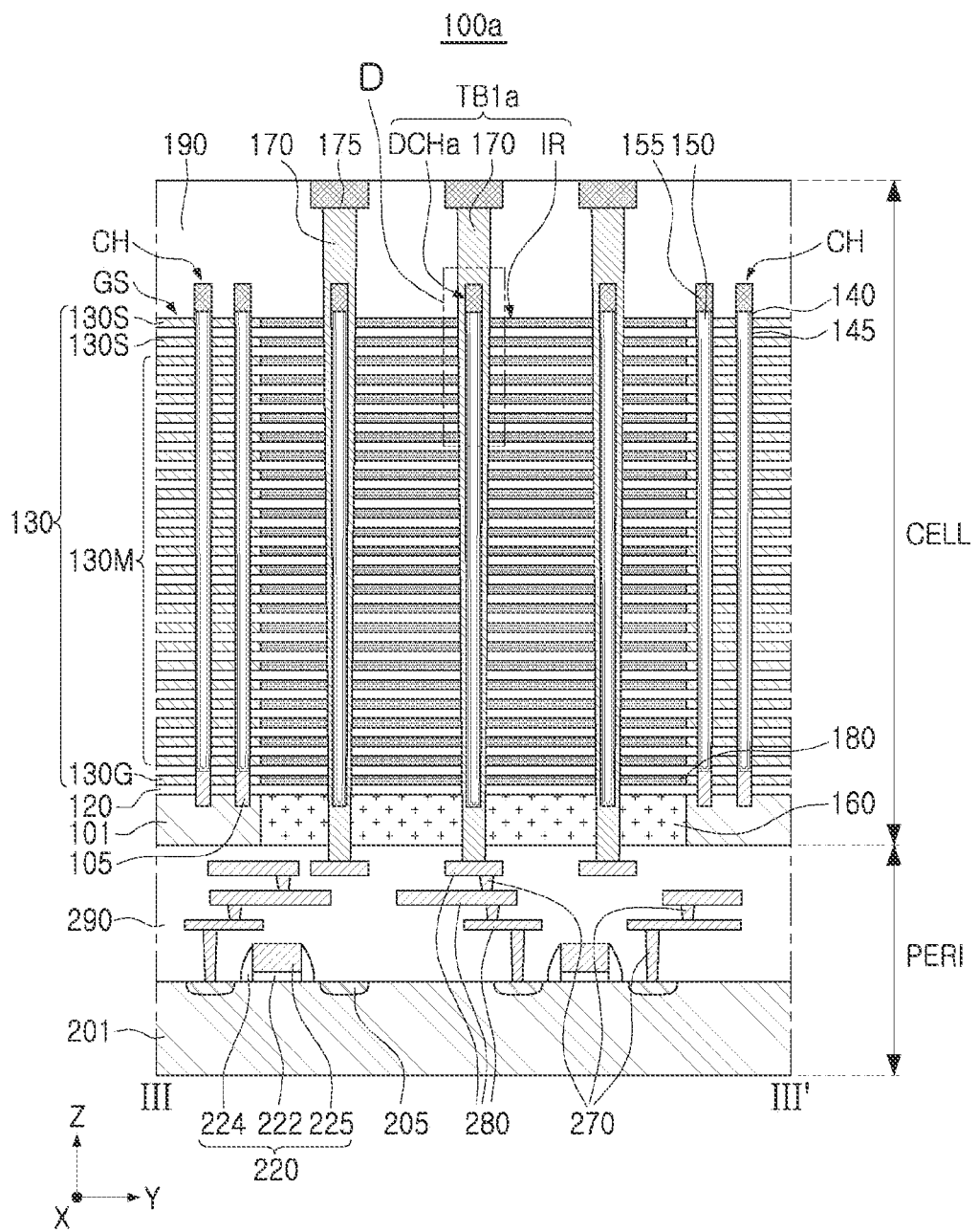

FIGS. 8 and 9 are schematic plan views and cross-sectional views of a semiconductor device according to some example embodiments. FIG. 9 illustrates a cross section taken along line III-III' of FIG. 8.

Referring to FIGS. 8 and 9, in a semiconductor device 100a, and different from the example embodiments described wiht reference to FIGS. 4 to 6, dummy channel structures DCHa in first and second through-wiring regions TB1a and TB2a may overlap through-contact plugs 170, respectively. Accordingly, as illustrated in FIG. 9, the dummy channel structures DCHa may be in the through-contact plugs 170. As such, a defect in which an electrical short occurs between the through-contact plugs 170 by contacting the dummy channel structure DCHa with two or more adjacent through-contact plugs 170 may be prevented. In some example embodiments, and similarly to the example embodiment of FIG. 7B, a portion of the dummy channel structures DCHa may not be completely in the through-contact plug 170, but may overlap the through-contact plug 170.

In the through-contact plugs 170, the dummy channel structures DCHa may have a structure corresponding to the channel structures CH. For example, the dummy channel structures DCHa may have the same structure as the channel structures CH, except for the epitaxial layer 105. In some example embodiments, the bottom of the dummy channel structures DCHa may be lower or higher than the bottom of the channel structures CH.

Figure 10A:
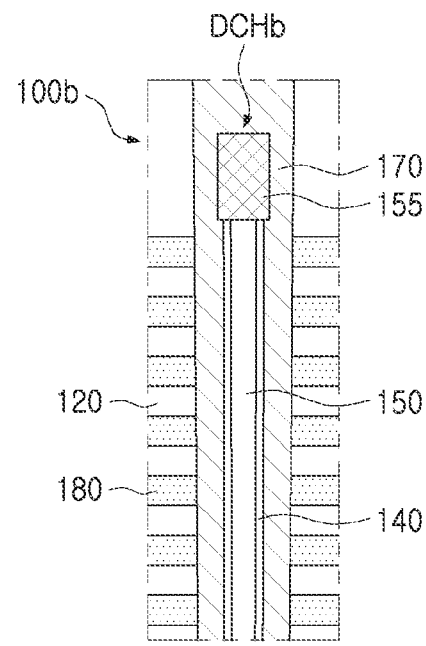
FIGS. 10A and 10B are partially enlarged views of a semiconductor device according to some example embodiments.
Figure 10B:
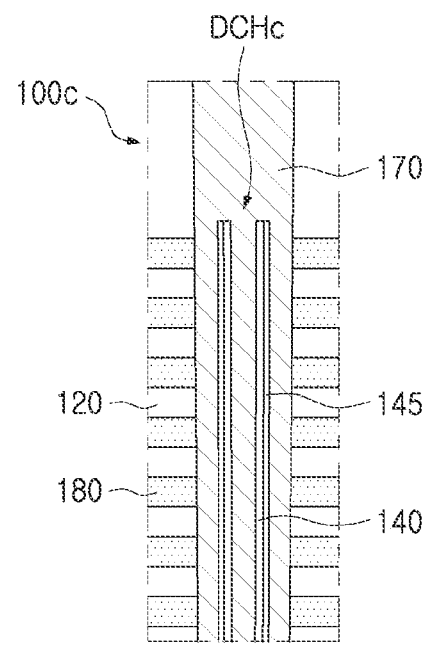

FIGS. 10A and 10B are partially enlarged views of a semiconductor device according to some example embodiments. FIGS. 10A and 10B are enlarged views of an area corresponding to area 'D' of FIG. 9.

Referring to FIG. 10A, in a semiconductor device 100b, a dummy channel structure DCHb in a through-contact plug 170 may not include some components, for example, the gate dielectric layer 145. Accordingly, the dummy channel structure DCHb may only include the channel layer 140, the channel insulating layer 150, and the channel pad 155. Such a structure may be formed by removing a material of the gate dielectric layer 145 together when forming a contact hole for the formation of the through-contact plug 170.

Referring to FIG. 10B, in a semiconductor device 100c, a dummy channel structure DCHc in a through-contact plug 170 may not include some components, for example, the channel insulating layer 150 and the channel pad 155. Accordingly, the dummy channel structure DCHc may only include the channel layer 140 and the gate dielectric layer 145. Such a structure may be formed by removing the channel pad 155 and removing the channel insulating layer 150 therebelow at the time of forming the contact hole for the formation of the through-contact plug 170. According to some example embodiments, the dummy channel structure DCHc may include only the channel layer 140, which may be changed depending on an etchant and etching conditions of the contact hole.

Figure 11:
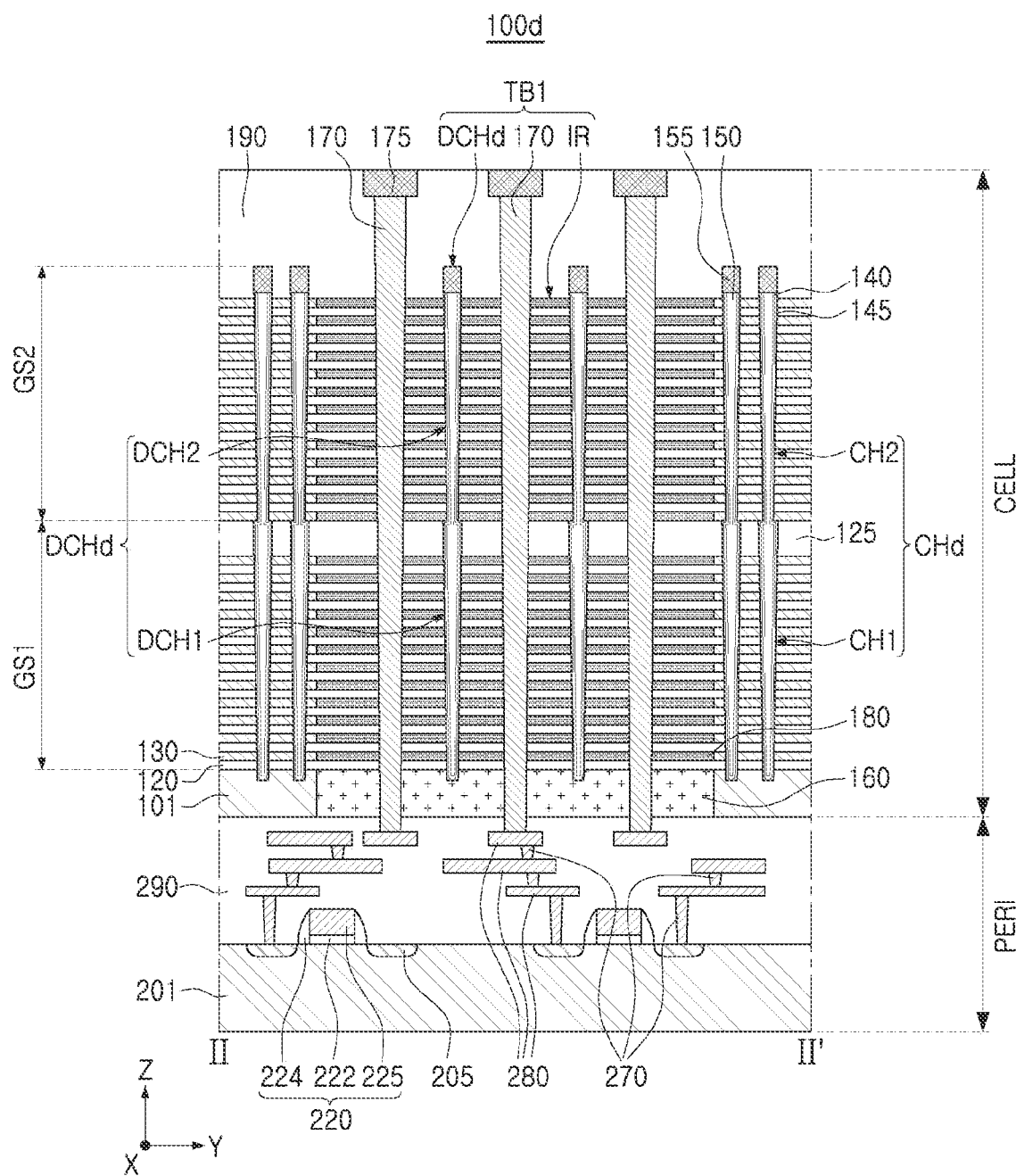
FIG. 11 is a schematic cross-sectional view of a semiconductor device according to some example embodiments.

FIG. 11 is a schematic cross-sectional view of a semiconductor device according to some example embodiments. FIG. 11 illustrates a cross section corresponding to FIG. 5B.

Referring to FIG. 11, in a semiconductor device 100d, stacked structures of gate electrodes 130 may include first and second stacked structures GS1 and GS2 stacked vertically, and each of channel structures CHd and dummy channel structures DCHd may include first and second channel structures CH1 and CH2 and first and second dummy channel structures DCH1 and DCH2, stacked vertically. The structures of the channel structures CHd and the dummy channel structures DCHd may be introduced to form the channel structures CHd and the dummy channel structures DCHd so as to be structurally stable, even when the number of the stacked gate electrodes 130 is relatively large.

The channel structures CHd may have a form in which first channel structures CH1 of a first stacked structure GS1 and second channel structures CH2 of a second stacked structure GS2 are connected to each other, and may have a bent portion formed by a difference in the width. A channel layer 140, a gate dielectric layer 145, and a channel insulating layer 150 may be connected to each other between the first channel structure CH1 and the second channel structure CH2. A channel pad 155 may only be on an upper end of the second channel structure CH2. However, in some example embodiments, each of the first channel structure CH1 and the second channel structure CH2 may include the channel pad 155, and as such, the channel pad 155 of the first channel structure CH1 may be connected to the channel layer 140 of the second channel structure CH2. The channel structures CHd may omit the epitaxial layer 105, differing from the example embodiments described with reference to FIGS. 5A and 5B, but the present disclosure is not limited thereto.

The dummy channel structures DCHd may have a structure substantially similar to the channel structures CHd. For example, the dummy channel structures DCHd may also have a form in which the first dummy channel structures DCH1 and the second dummy channel structures DCH2 are connected. A relatively thick upper interlayer insulating layer 125 may be on the top of the first stacked structure GS1. However, the shapes of interlayer insulating layers 120 and the upper interlayer insulating layer 125 may be variously changed in example embodiments. For at least some configurations, the description provided above with reference to FIGS. 4 to 6 may be applied.

Figure 12A:
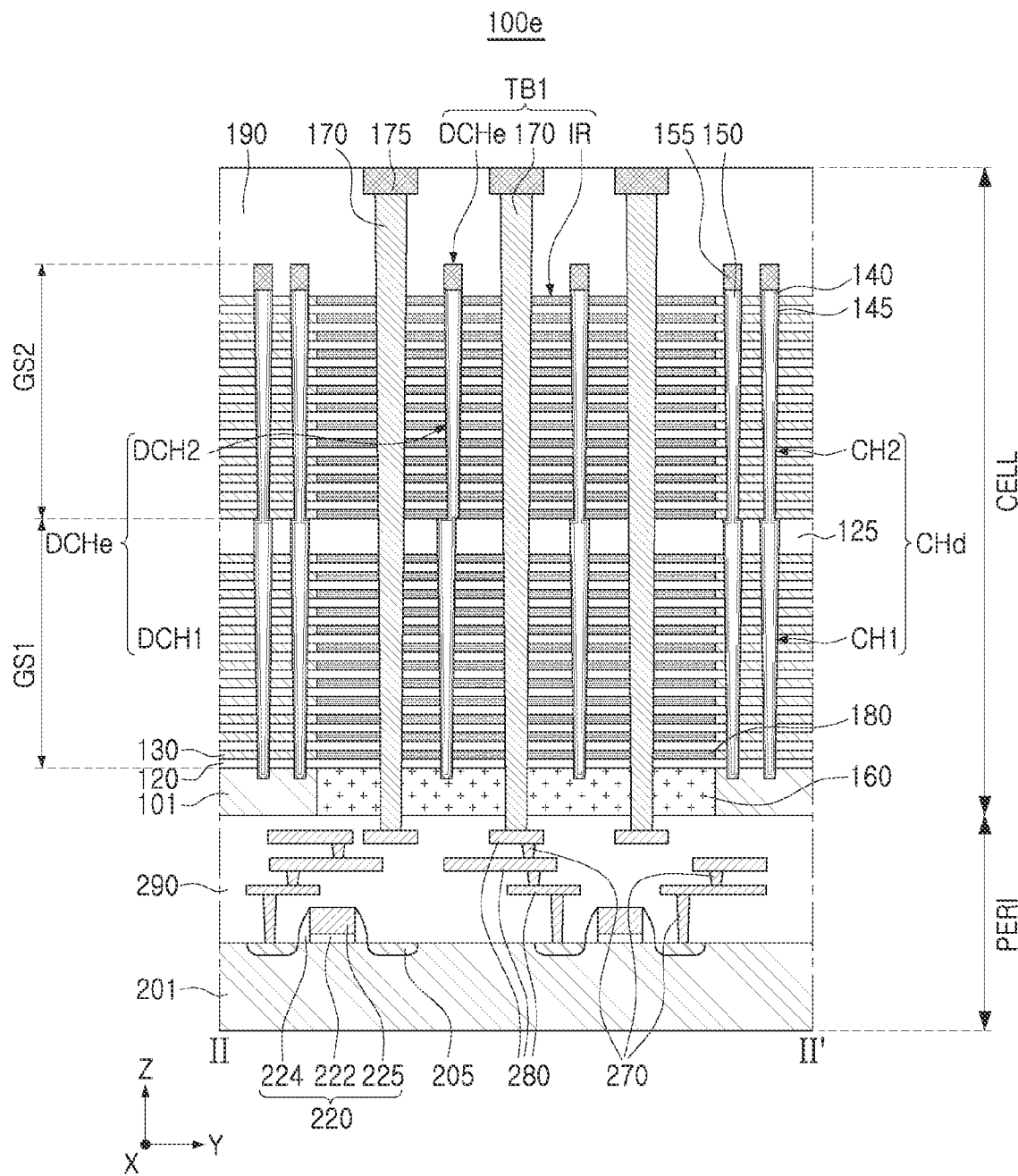
FIGS. 12A to 12C are schematic cross-sectional views of a semiconductor device according to some example embodiments.
Figure 12B:
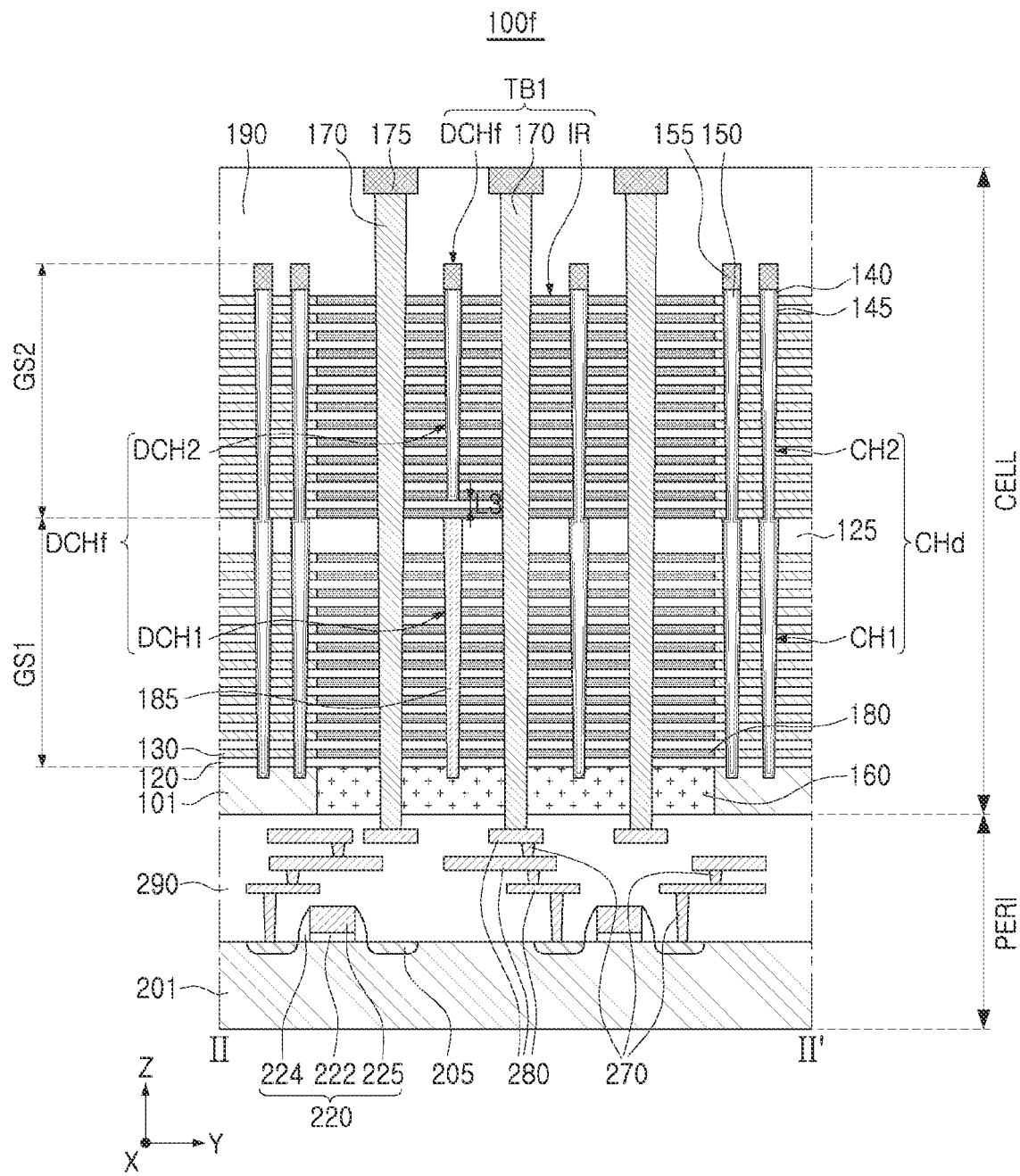
Figure 12C:
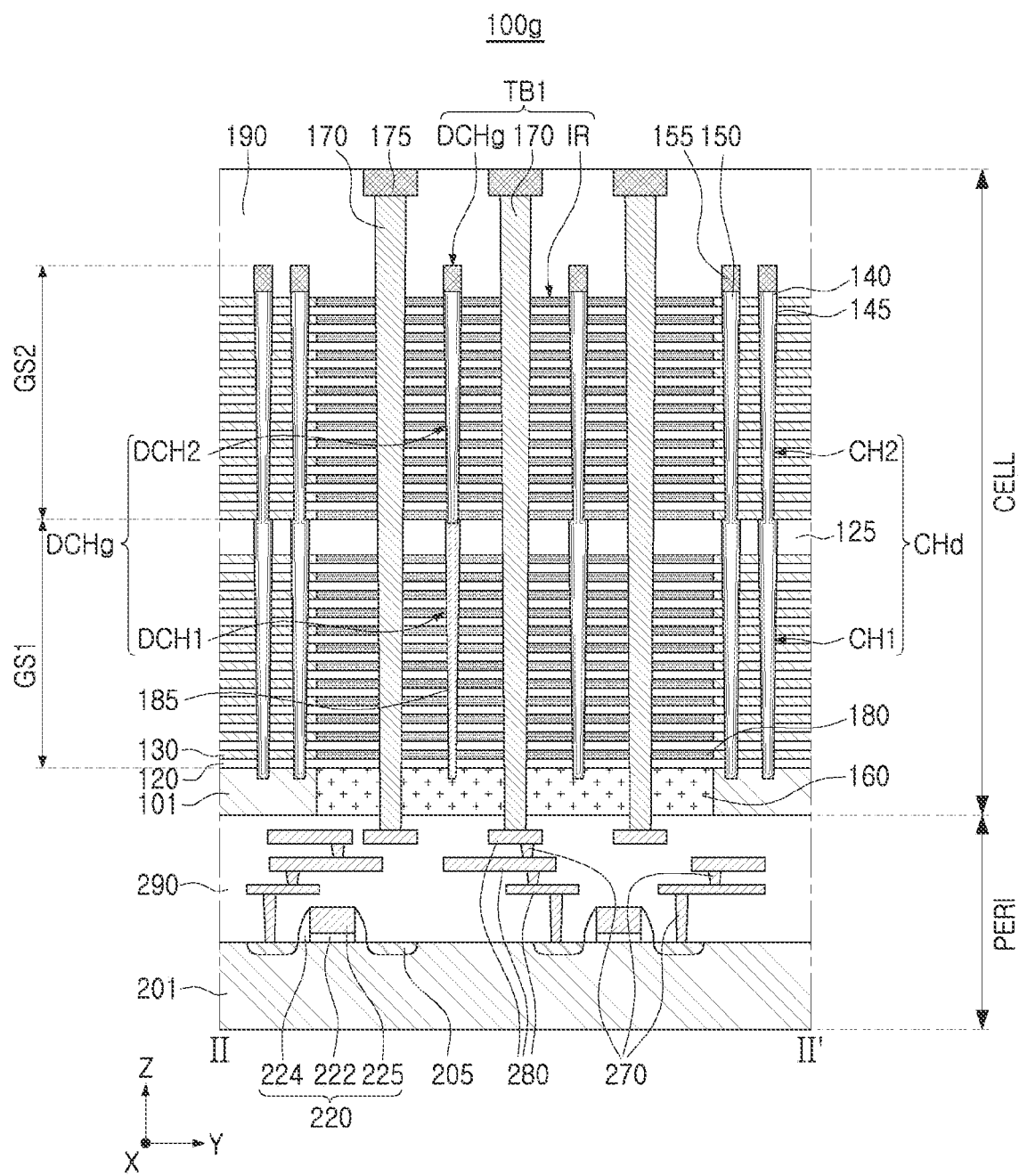

FIGS. 12A to 12C are schematic cross-sectional views of semiconductor devices according to some example embodiments. FIGS. 12A to 12C illustrate cross sections corresponding to FIG. 11.

Referring to FIG. 12A, in a semiconductor device 100e, at least a portion of dummy channel structures DCHe may have a form in which a first dummy channel structure DCH1 and a second dummy channel structure DCH2 are shifted in a horizontal direction, for example, a Y direction, which may be caused by a process error during formation of the dummy channel structures DCHe. In greater detail, in instances in which the process conditions are determined by prioritizing the formation of the channel structures CHd, such a structure may be formed in the dummy channel structures DCHe that do not substantially form a memory cell string.

With reference to FIG. 12B, a semiconductor device 100f may have a form in which at least portions of the dummy channel structures DCHf, for example, the first dummy channel structure DCH1 and the second dummy channel structure DCH2 are spaced apart from each other in a vertical direction, for example, in a Z direction. The first dummy channel structure DCH1 and the second dummy channel structure DCH2 may be spaced apart from each other by a predetermined length L3 and not connected to each other. The length L3 may be variously changed in example embodiments, and the lengths may be different from each other in two or more dummy channel structures DCHf.

The lower first dummy channel structure DCH1 may have a structure different from that of the upper second dummy channel structure DCH2. In greter detail, the first dummy channel structure DCH1 may have a structure in which a channel sacrificial layer 185 is filled. For example, this structure may be formed if the channel sacrificial layer 185 is not removed through a channel hole forming the second dummy channel structure DCH2 and remains in the manufacturing of the dummy channel structures DCHf.

Referring to FIG. 12C, in a semiconductor device 100g, at least a portion of dummy channel structures DCHg may have a structure in which structures of a lower first dummy channel structure DCH1 and an upper second dummy channel structure DCH2 are different. Similar to the example embodiments described with reference to FIG. 12B, at least one of the first dummy channel structures DCH1 may have a structure filled with the channel sacrificial layer 185. However, unlike in the example embodiments described with reference to FIG. 12B, even when the first dummy channel structure DCH1 and the second dummy channel structure DCH2 are connected to each other, the first dummy channel structure DCH1 may have such a structure. This structure may be formed if the channel sacrificial layer 185 is not removed through the channel hole forming the second dummy channel structure DCH2 in manufacturing the dummy channel structures DCHg in the case in which the width of the first dummy channel structure DCH1 is relatively small.

Referring to FIGS. 13A to 13E are schematic cross-sectional views illustrating a method of manufacturing a semiconductor device according to some example embodiments. In FIGS. 13A to 13E, regions corresponding to the region illustrated in FIG. 5A are illustrated.

Figure 13A:
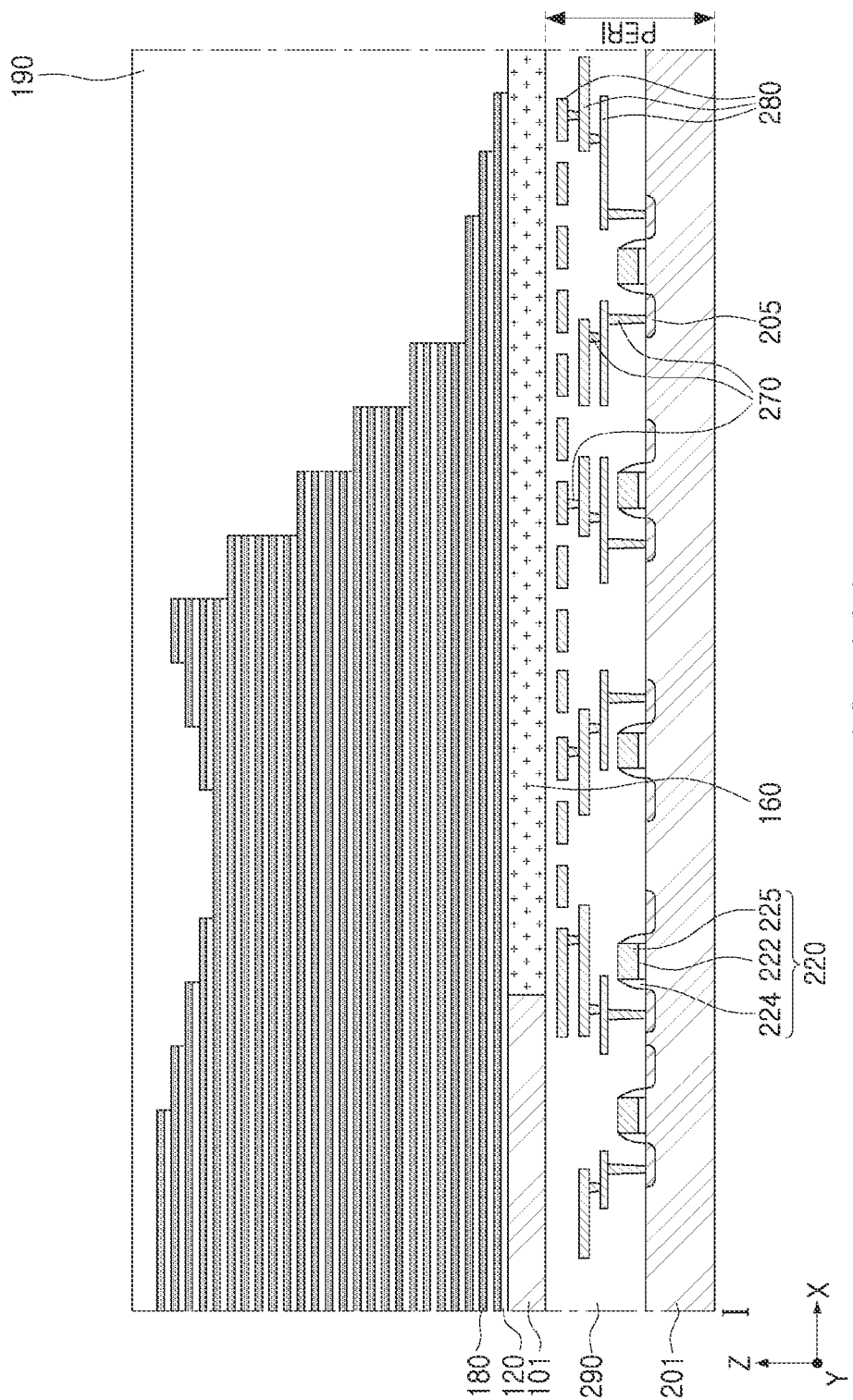
FIGS. 13A to 13E are schematic cross-sectional views illustrating a method of manufacturing a semiconductor device according to some example embodiments.

Referring to FIG. 13A, a peripheral circuit region PERI including circuit devices 220 and lower wiring structures may be formed on a base substrate 201, and a substrate 101 and a substrate insulating layer 160, on which a memory cell region is provided, may be formed on the peripheral circuit region PERI, and then, sacrificial insulating layers 180 and interlayer insulating layers 120 may be alternately stacked.

First, a circuit gate dielectric layer 222 and a circuit gate electrode 225 may be sequentially formed on the base substrate 201. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of a polycrystalline silicon or metal silicide layer, but an example embodiment thereof is not limited thereto. Next, spacer layers 224 and source/drain regions 205 may be formed on both sidewalls of the circuit gate dielectric layer 222 and the circuit gate electrode 225. In some example embodiments, the spacer layer 224 may also be formed of a plurality of layers. Subsequently, the source/drain regions 205 may be formed by performing an ion implantation process.

Circuit contact plugs 270 of the lower wiring structures may be formed by forming a portion of a peripheral region insulating layer 290 and then performing partial etching and removal, and filling a conductive material. Lower wiring lines 280 may be formed by, for example, depositing a conductive material and then patterning the conductive material.

The peripheral region insulating layer 290 may be formed of a plurality of insulating layers. The peripheral region insulating layer 290 may be partially formed in respective steps of forming the lower wiring structures, and may be formed to finally cover the circuit devices 220 and the lower wiring structures by forming a portion of the peripheral region insulating layer 290 on an uppermost lower wiring line 280.

Next, the substrate 101 may be formed on the peripheral region insulating layer 290. The substrate 101 may be formed of polycrystalline silicon, for example, and may be formed by a CVD process. The polycrystalline silicon constituting the substrate 101 may include impurities. The substrate 101 may be formed to be smaller than or equal to the size of the base substrate 201.

The substrate insulating layer 160 may be formed by removing a portion of the substrate 101 from regions corresponding to the first and second through-wiring regions TB1 and TB2 and then filling an insulating material. After filling the insulating material, a planarization process may be further performed using a chemical mechanical polishing (CMP) process. As a result, an upper surface of the substrate insulating layer 160 may be substantially coplanar with an upper surface of the substrate 101.

The sacrificial insulating layers 180 may be layers in which portions of the sacrificial insulating layers 180 are replaced by gate electrodes 130 (see FIG. 5A) through a subsequent process. The sacrificial insulating layers 180 may be formed of a material different from that of the interlayer insulating layers 120, and may be formed of a material that may be etched with etch selectivity with respect to the interlayer insulating layers 120 under specific etching conditions. For example, the interlayer insulating layer 120 may be formed of at least one of silicon oxide and silicon nitride, and the sacrificial insulating layers 180 may be formed of a material, which is selected from silicon, silicon oxide, silicon carbide and silicon nitride and which is different that of the interlayer insulating layer 120. In some example embodiments, the thicknesses of the interlayer insulating layers 120 may not all be the same. The thicknesses of the interlayer insulating layers 120 and the sacrificial insulating layers 180, and the number of the interlayer insulating layers 120 and the sacrificial insulating layers 180, may be variously changed from those illustrated in the drawings.

In the second region B of FIG. 4, a photolithography process and an etching process for the sacrificial insulating layers 180 may be repeatedly performed using a mask layer, such that the upper sacrificial insulating layers 180 extend less than the lower sacrificial insulating layers 180. As a result, the sacrificial insulating layers 180 may have a step shape, and may provide pad regions.

Next, a cell region insulating layer 190 may be formed to cover an upper portion of a stacked structure of the sacrificial insulating layers 180 and the interlayer insulating layers 120.

Figure 13B:
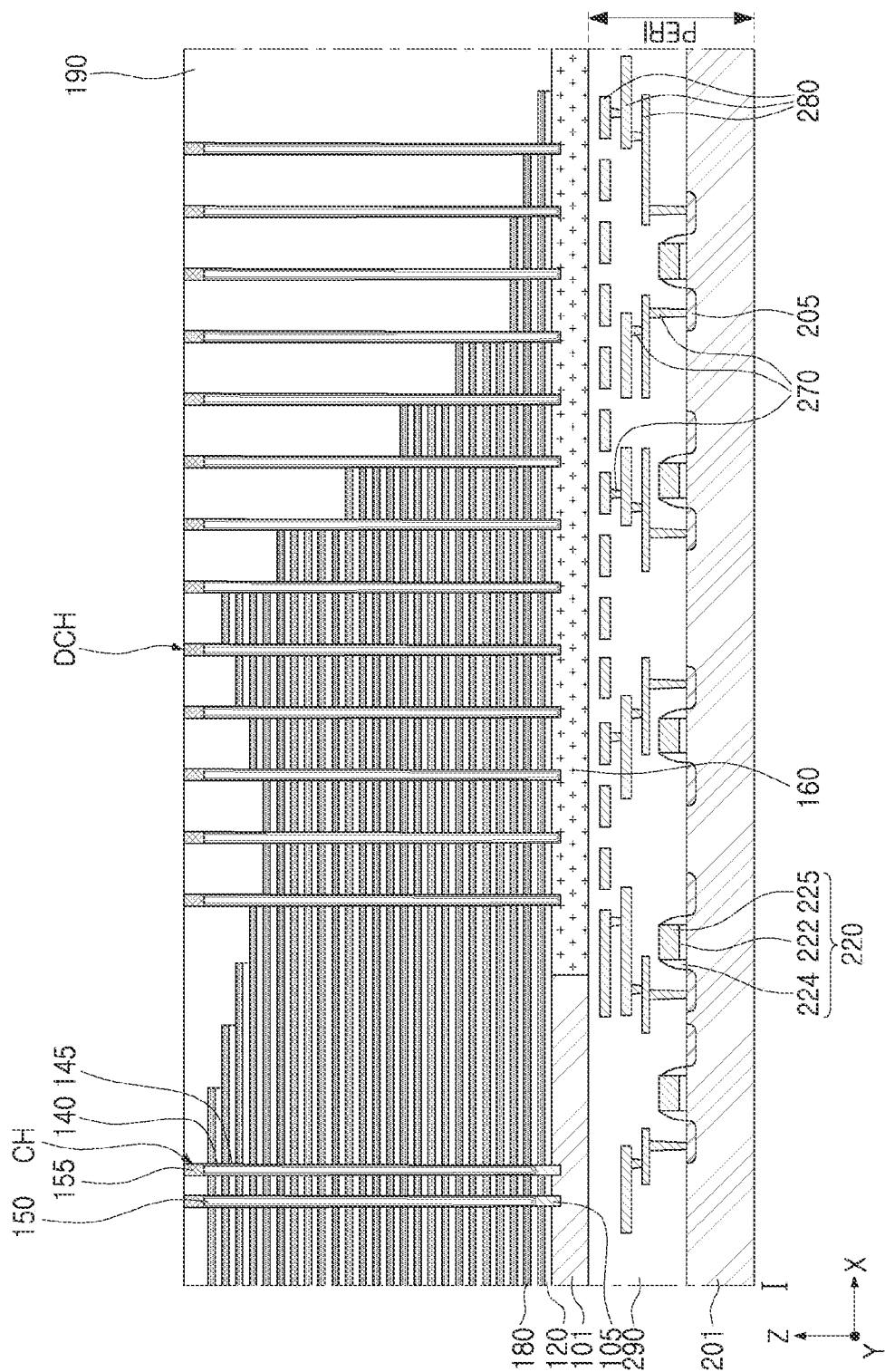

Referring to FIG. 13B, channel structures CH and dummy channel structures DCH may be formed to penetrate through the stacked structure of the sacrificial insulating layers 180 and the interlayer insulating layers 120.

First, a portion of the sacrificial insulating layers 180 and the interlayer insulating layers 120 may be removed to form a string separation region SS (see FIG. 4) in an area not illustrated in FIG. 13B. The string separation region SS may be formed by exposing a region in which the string separation region SS is to be formed using a separate mask layer, removing a predetermined number of sacrificial insulating layers 180 and interlayer insulating layers 120 from an uppermost portion and then depositing an insulating material. The string separation region SS may extend to be lower than a position of the region in which the upper gate electrodes 130S of FIG. 4 are formed.

The channel structures CH and the dummy channel structures DCH may be formed by anisotropically etching the sacrificial insulating layers 180 and the interlayer insulating layers 120, and may be formed by forming channel holes in the form of holes and then filling the channel holes. Together with the channel holes for the channel structures CH, the channel holes for the dummy channel structures DCH are formed together in the region in which first and second through-wiring regions TB1 and TB2 are to be formed, such that the channel holes may be continuously formed, and thus may avoid being discontinuous. Therefore, the channel holes may be formed to have a uniform size and shape irrespective of the region, thereby securing electrical characteristics of the channel structures CH.

Due to the height of the stacked structure, sidewalls of the channel structures CH and the dummy channel structures DCH may not be perpendicular to the upper surface of the substrate 101. In some example embodiments, the channel structures CH and the dummy channel structures DCH may be formed to allow portions of the substrate 101 and the substrate insulating layer 160 to be recessed, respectively. Next, an epitaxial layer 105 may be formed in the channel structures CH, and in the channel structures CH and the dummy channel structures DCH, at least a portion of the gate dielectric layer 145, a channel layer 140, a channel insulating layer 150 and a channel pads 155 may be sequentially formed.

In the channel structures CH, the epitaxial layer 105 may be formed using a selective epitaxial growth (SEG). The epitaxial layer 105 may be formed of a single layer or a plurality of layers. The epitaxial layer 105 may include polycrystalline germanium, single crystalline germanium, single crystalline silicon or polycrystalline silicon doped with or without impurities. In some embodiments, the epitaxial layer 105 may be omitted.

The gate dielectric layer 145 may be formed to have a uniform thickness using an ALD or CVD process. In this step, the entirety or a portion of the gate dielectric layer 145 may be formed, and a portion of the gate dielectric layer extending perpendicular to the substrate 101 along the channel structures CH and the dummy channel structures DCH may be formed in this step. The channel layer 140 may be formed on the gate dielectric layer 145 in the channel structures CH and the dummy channel structures DCH. The channel insulating layer 150 may be formed to fill the channel structures CH and the dummy channel structures DCH, and may be an insulating material. In some example embodiments, a conductive material instead of the channel insulating layer 150 may also fill between the channel layers 140. The channel pad 155 may be formed of a conductive material, for example, formed of polycrystalline silicon.

Figure 13C:
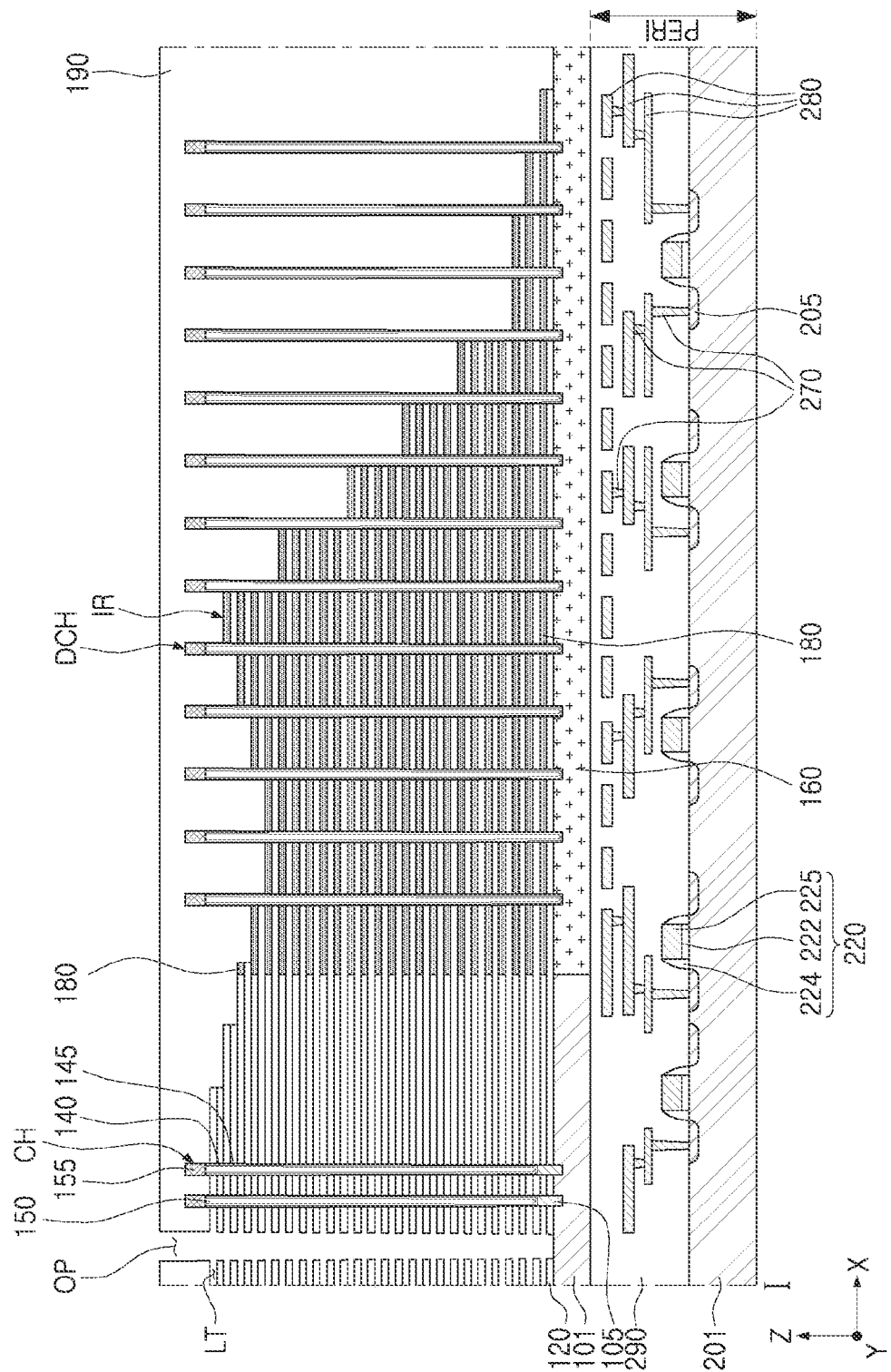

Referring to FIG. 13C, an opening OP is formed to penetrate through the stacked structure of the sacrificial insulating layers 180 and the interlayer insulating layers 120, and portions of the sacrificial insulating layers 180 may be removed through the opening OP to form tunnel portions LT.

First, before forming the opening OP, the cell region insulating layer 190 may be formed on the channel structures CH and the dummy channel structures DCH. The opening OP may be formed in positions of the first and second separation regions MS1 and MS2 of FIG. 4. The opening OP may be formed by forming a mask layer using a photolithography process and anisotropically etching the stacked structure. The opening OP may be formed in a trench shape extending in the Y direction, and the substrate 101 may be exposed to a lower portion of the opening OP.

The sacrificial insulating layers 180 may be removed from the outside of an insulating region IR, for example, the outside region of the first and second through-wiring regions TB1 and TB2 (see FIG. 4). As a result, the insulating region IR of the first and second through-wiring regions TB1 and TB2 including the interlayer insulating layers 120, the sacrificial insulating layers 180 and the substrate insulating layer 160 may be defined. The sacrificial insulating layers 180 may be selectively removed with respect to the interlayer insulating layers 120 and the substrate insulating layer 160, for example, using wet etching. Accordingly, a plurality of tunnel portions LT may be formed between the interlayer insulating layers 120, and some sidewalls of the gate dielectric layer 145 of the channel structures CH may be exposed through second tunnel portions LT2.

The areas in which the first and second through-wiring regions TB1 and TB2 are formed may be spaced apart from the opening OP such that an etchant may not reach the areas, and thus, may be a region in which the sacrificial insulating layers 180 remain. Therefore, the first and second through-wiring regions TB1 and TB2 may be centered between the adjacent openings OP. The region in which the sacrificial insulating layers 180 remain may not exactly match the region in which the substrate insulating layer 160 is provided.

Figure 13D:
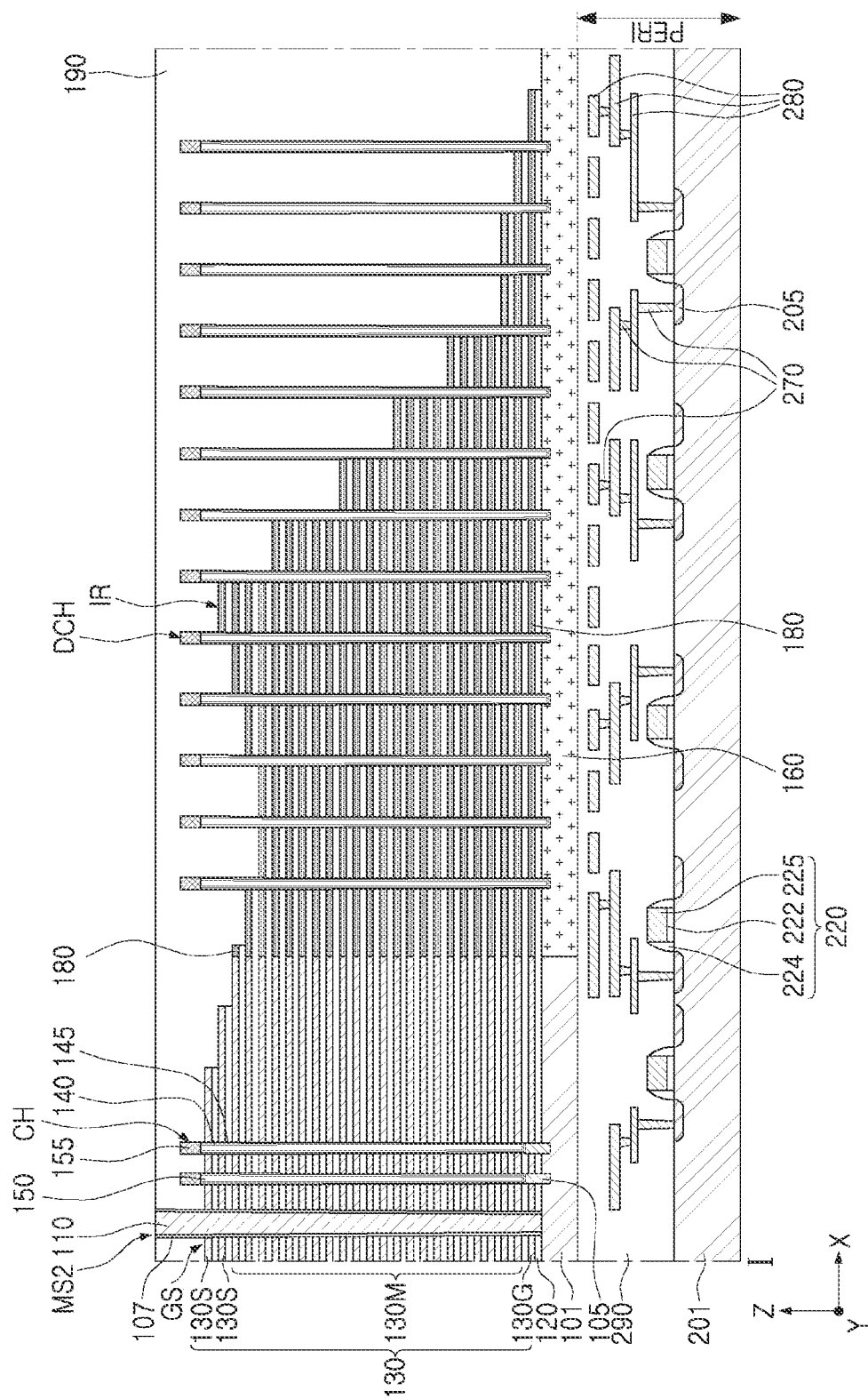

Referring to FIG. 13D, the gate electrodes 130 are formed by filling the tunnel portions LT in which the sacrificial insulating layers 180 have been partially removed with a conductive material, and an isolation insulating layer 107 and a conductive layer 110 may be formed in the opening OP.

The conductive material forming the gate electrodes 130 may fill the tunnel portions LT. The conductive material may include a metal, polycrystalline silicon or a metal silicide material. Side surfaces of the gate electrodes 130 may contact side surfaces of the sacrificial insulating layers 180 of the insulating region IR. After the gate electrodes 130 are formed, the conductive material deposited in the opening OP may also be removed through an additional process.

The isolation insulating layer 107 may be formed in the form of a spacer in the opening OP. For example, after an insulating material is deposited, the isolation insulating layer 107 may be formed by removing the insulating material formed on the substrate 101 below the opening OP. Next, a conductive material may be deposited on the isolation insulating layer 107 to form the conductive layer 110. For example, the isolation insulating layer 107 and the conductive layer 110 may be formed in the same process in the first and second separation regions MS1 and MS2 to have the same structure. In this case, as described above, for example, the conductive layer 110 in the first separation regions MS1 may function as a common source line CSL, and the conductive layer 110 in the second separation regions MS2 may function as a dummy common source line. In some example embodiments, the process of forming the conductive layer 110 may be omitted.

Figure 13E:
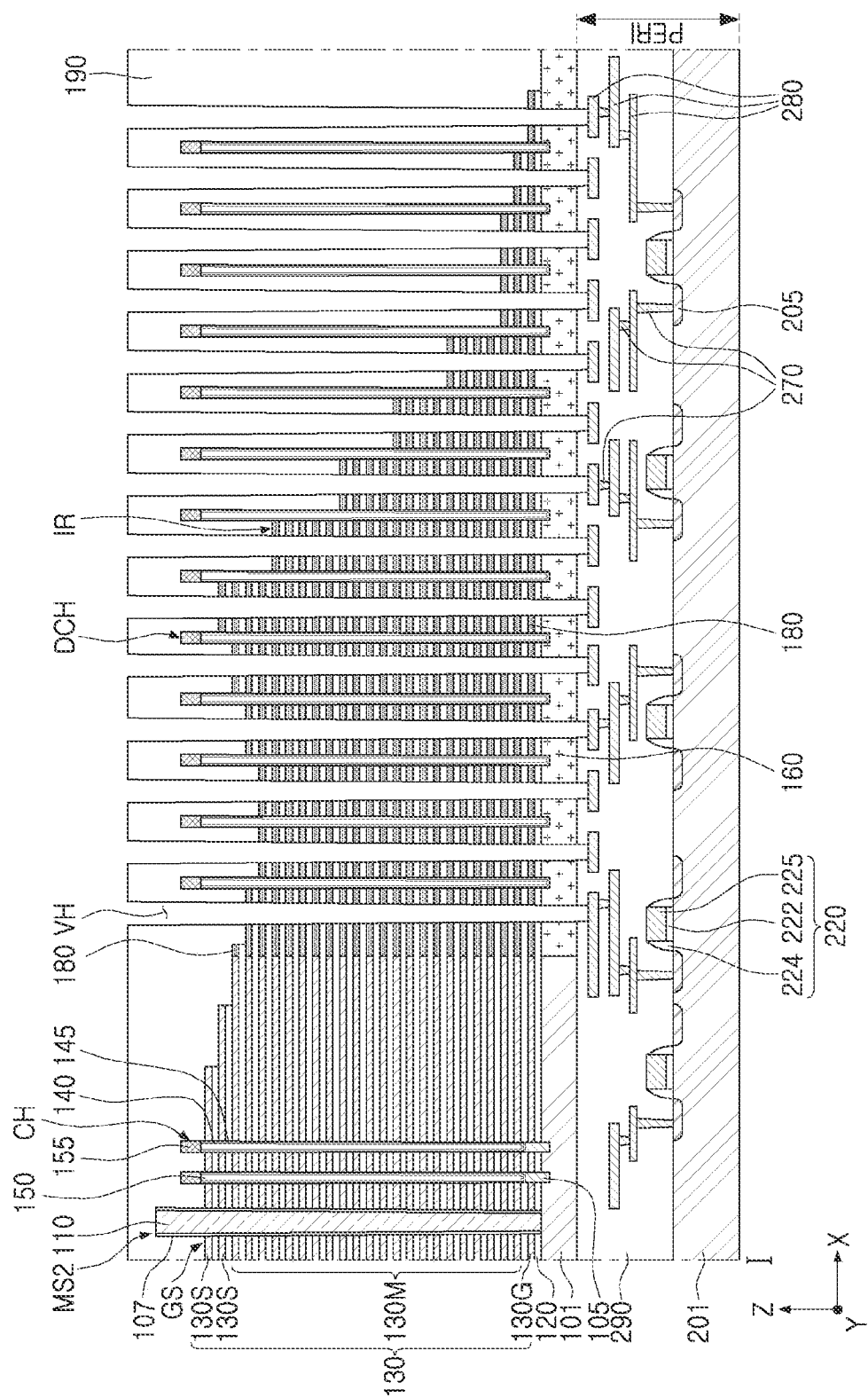

Referring to FIG. 13E, contact holes VH for the formation of through-contact plugs 170 may be formed.

Before forming the contact holes VH, the cell region insulating layer 190 may be formed to cover the isolation insulating layer 107. Next, the contact holes VH penetrating through the cell region insulating layer 190 and the insulating region IR may be formed from the upper portion of the insulating region IR. A circuit wiring line 280 of the peripheral circuit region PERI may be exposed to lower ends of the contact holes VH.

Next, referring to FIG. 13E together with FIG. 5B, the through-contact plugs 170 may be formed by filling the contact holes VH with a conductive material, thereby forming the first and second through-wiring regions TB1 and TB2, and the semiconductor device 100 may be manufactured by forming a wiring line 175 connected to upper ends of the through-contact plugs 170.

The manufacturing method described above with reference to FIGS. 13A to 13E is one example for manufacturing the semiconductor device 100 described with reference to FIGS. 4 to 6, and the semiconductor device 100 may be manufactured by various manufacturing methods.

FIGS. 14A to 14F are schematic cross-sectional views illustrating a method of manufacturing a semiconductor device according to some example embodiments. In FIGS. 14A to 14F, regions corresponding to the region illustrated in FIG. 11 are illustrated. Hereinafter, descriptions which overlap the description above with reference to FIGS. 13A to 13E will be omitted in the interest of brevity.

Figure 14A:
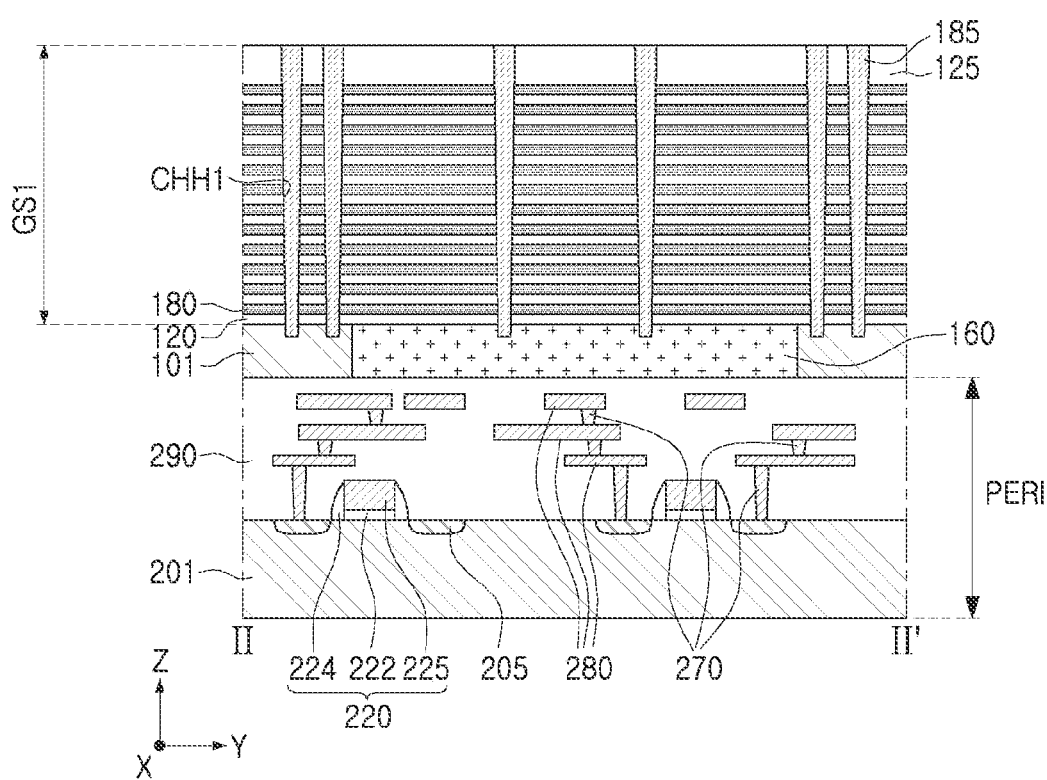
FIGS. 14A to 14F are schematic cross-sectional views illustrating a method of manufacturing a semiconductor device according to some example embodiments.

Referring to FIG. 14A, after forming a peripheral circuit region PERI and forming thereon a substrate 101 and a substrate insulating layer 160 provided with a memory cell region a first stacked structure GS1 may be formed. The first stacked structure GS1 may include alternately stacked sacrificial insulating layers 180 and interlayer insulating layers 120. First channel holes CHH1 may be formed and may be filled with channel sacrificial layers 185.

An upper interlayer insulating layer 125 that is relatively thicker than the interlayer insulating layer 120 may be formed as an uppermost interlayer insulating layer. The channel sacrificial layers 185 may be formed of a material that may be etched with etch selectivity with respect to the sacrificial insulating layers 180 and the interlayer insulating layers 120. For example, the channel sacrificial layers 185 may include silicon (Si).

Figure 14B:
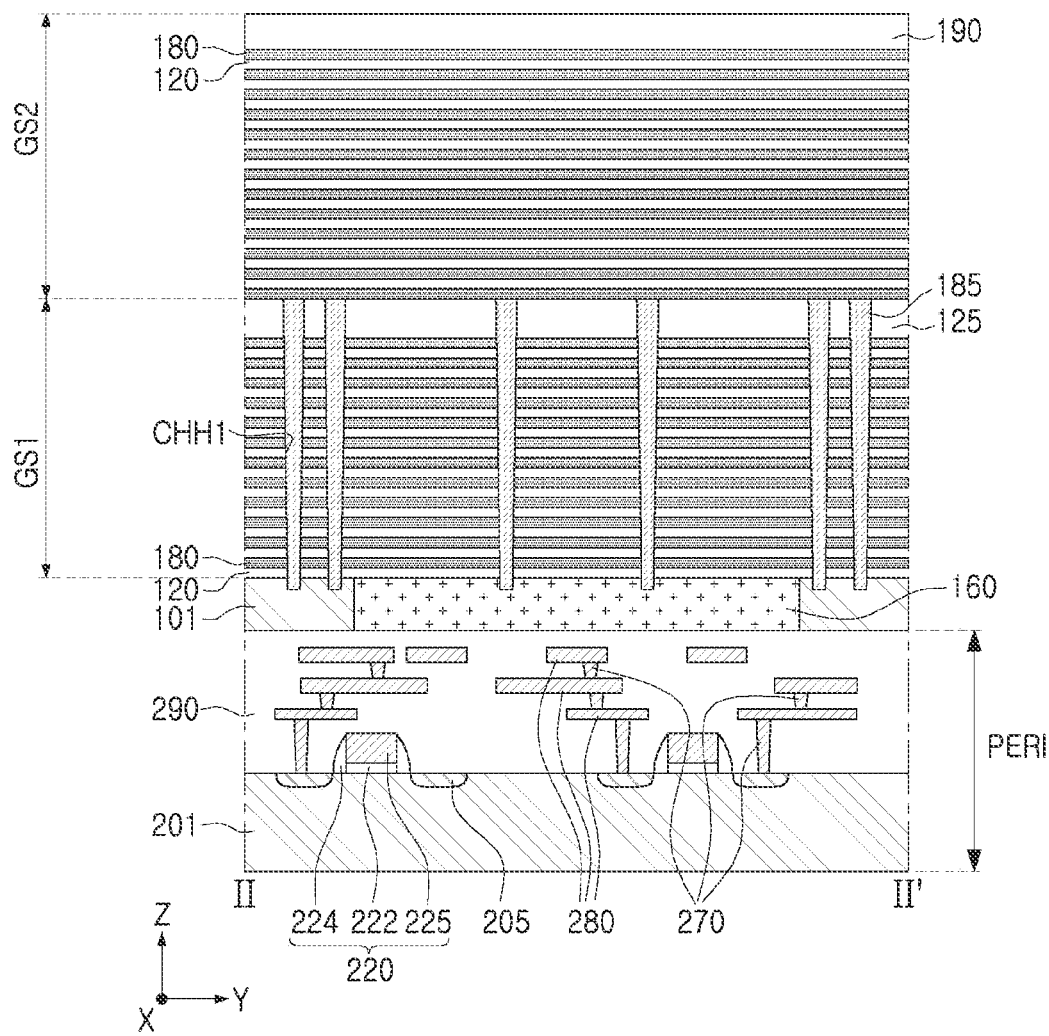

Referring to FIG. 14B, a second stacked structure GS2 may be formed by alternately stacking the sacrificial insulating layers 180 and the interlayer insulating layers 120 on the first stacked structure GS1.

Similar to the first stacked structure GS1, the second stacked structure GS2 may be formed by alternately stacking the sacrificial insulating layers 180 and the interlayer insulating layers 120 on the upper interlayer insulating layer 125 and the channel sacrificial layers 185 and forming the cell region insulating layer 190.

Figure 14C:
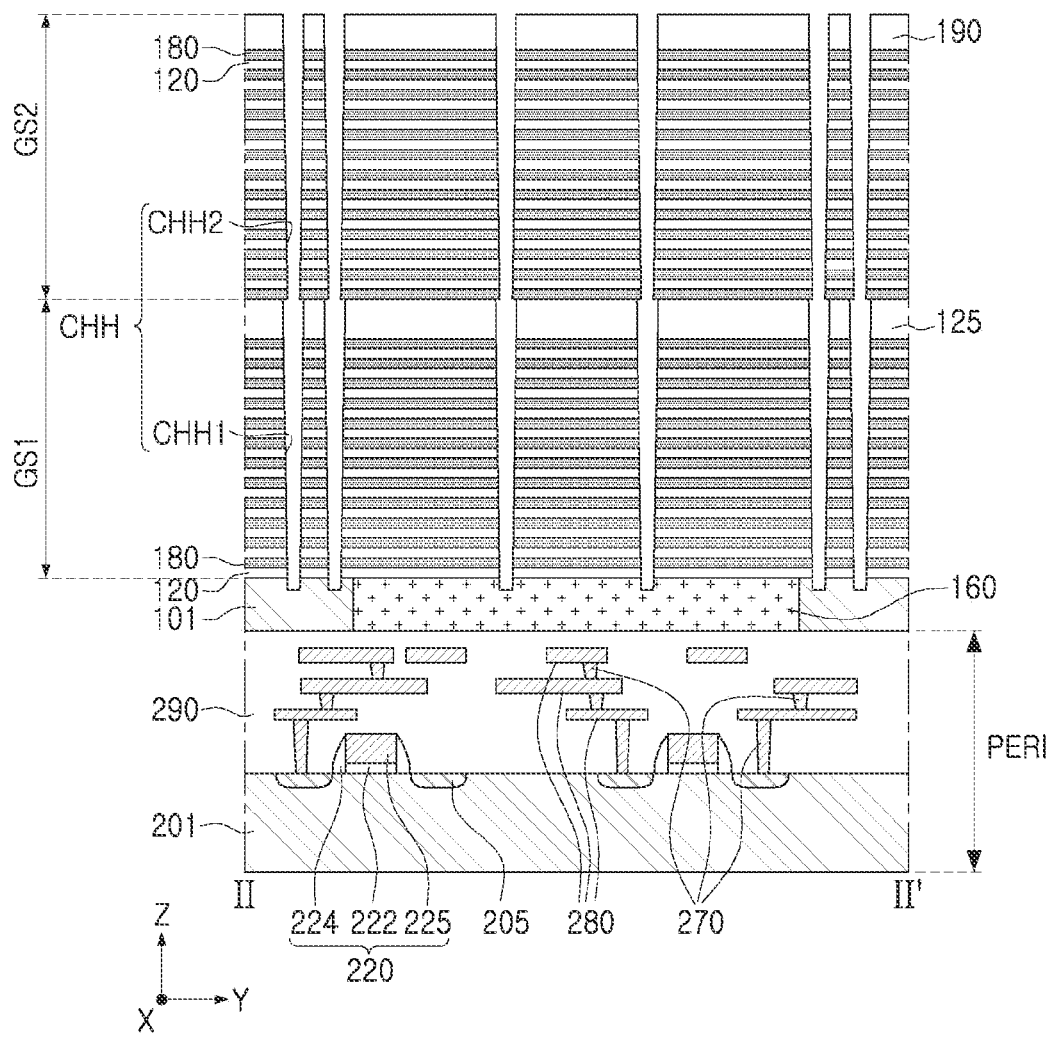

Referring to FIG. 14C, second channel holes CHH2 penetrating through the second stacked structure GS2 may be formed, and the channel sacrificial layers 185 in the first channel holes CHH1 may be removed.

First, the second channel holes CHH2 may be formed to be aligned with the first channel holes CHH1, respectively. In greater detail, after a photoresist layer is patterned on the second stacked structure GS2 to expose a portion of the second stacked structure GS2, the second stacked structure GS2 may be etched in the exposed area to form the second channel holes CHH2. Next, channel holes CHH in which the first channel holes CHH1 and the second channel holes CHH2 are connected may be formed by removing the channel sacrificial layers 185 exposed through the second channel holes CHH2.

The channel holes CHH may be formed in the area in which dummy channel structures DCHd are provided in addition to the area in which channel structures CHd are provided, and thus, may be continuously patterned, thereby having a uniform size and shape. Therefore, through a subsequent process, in the channel structures CHd formed adjacently to first and second through-wiring regions TB1 and TB2, defects due to patterning problems may be prevented and electrical characteristics may be secured.

Figure 14D:
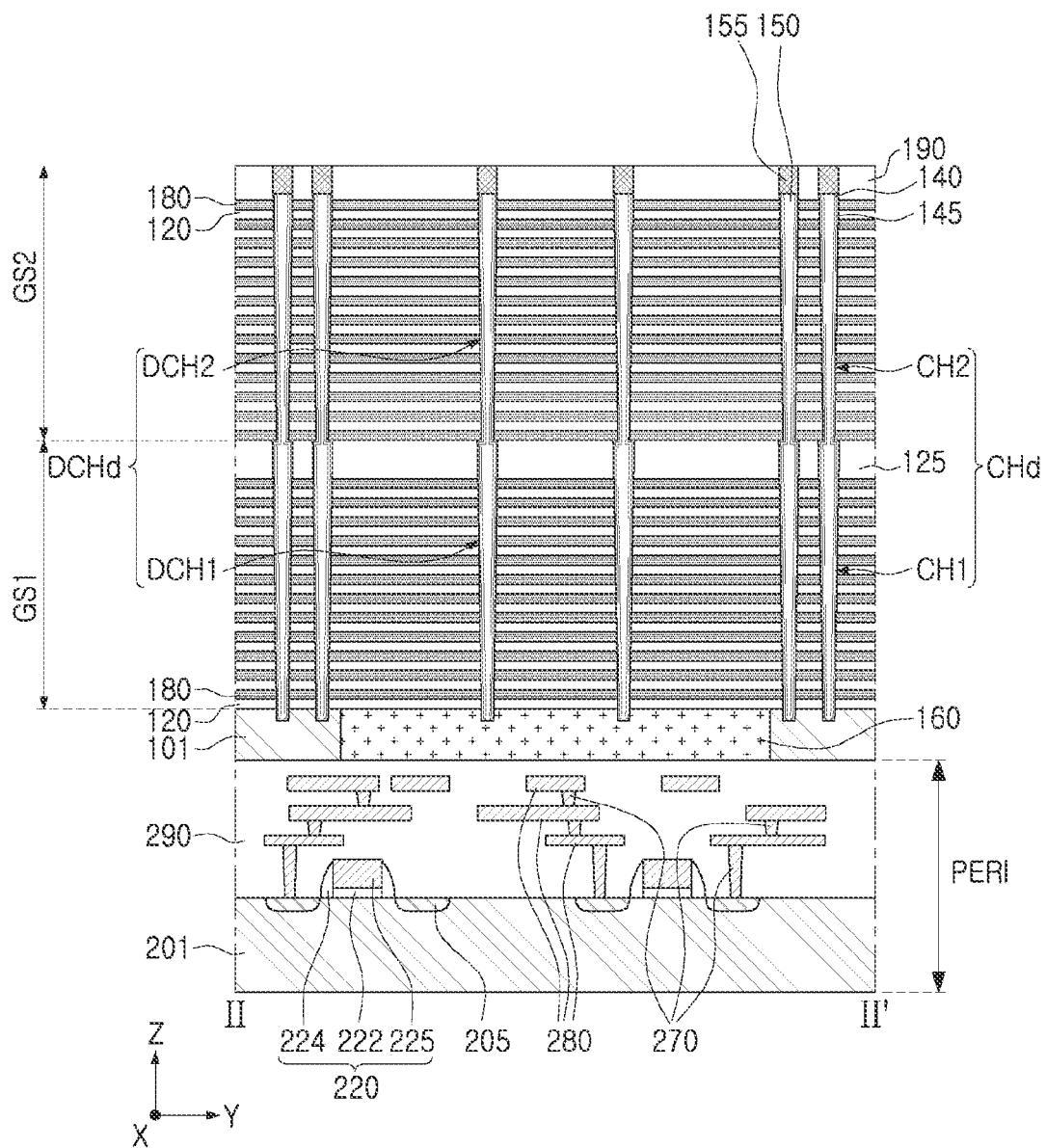

Referring to FIG. 14D, the channel structures CHd and dummy channel structures DCHd may be formed.

The channel structures CHd and the dummy channel structures DCHd may be formed in such a manner that first and second channel structures CH1 and CH2 and first and second dummy channel structures DCH1 and DCH2 are connected as one. The channel structures CHd and the dummy channel structures DCHd may be formed by sequentially forming at least a portion of a gate dielectric layer 145, a channel layer 140, a channel insulating layer 150 and channel pads 155 in the channel holes CHH. A portion of the gate dielectric layer 145 may be removed from lower ends of the channel holes CHH such that the channel layer 140 may be in direct contact with the substrate 101 and the substrate insulating layer 160.

Figure 14E:
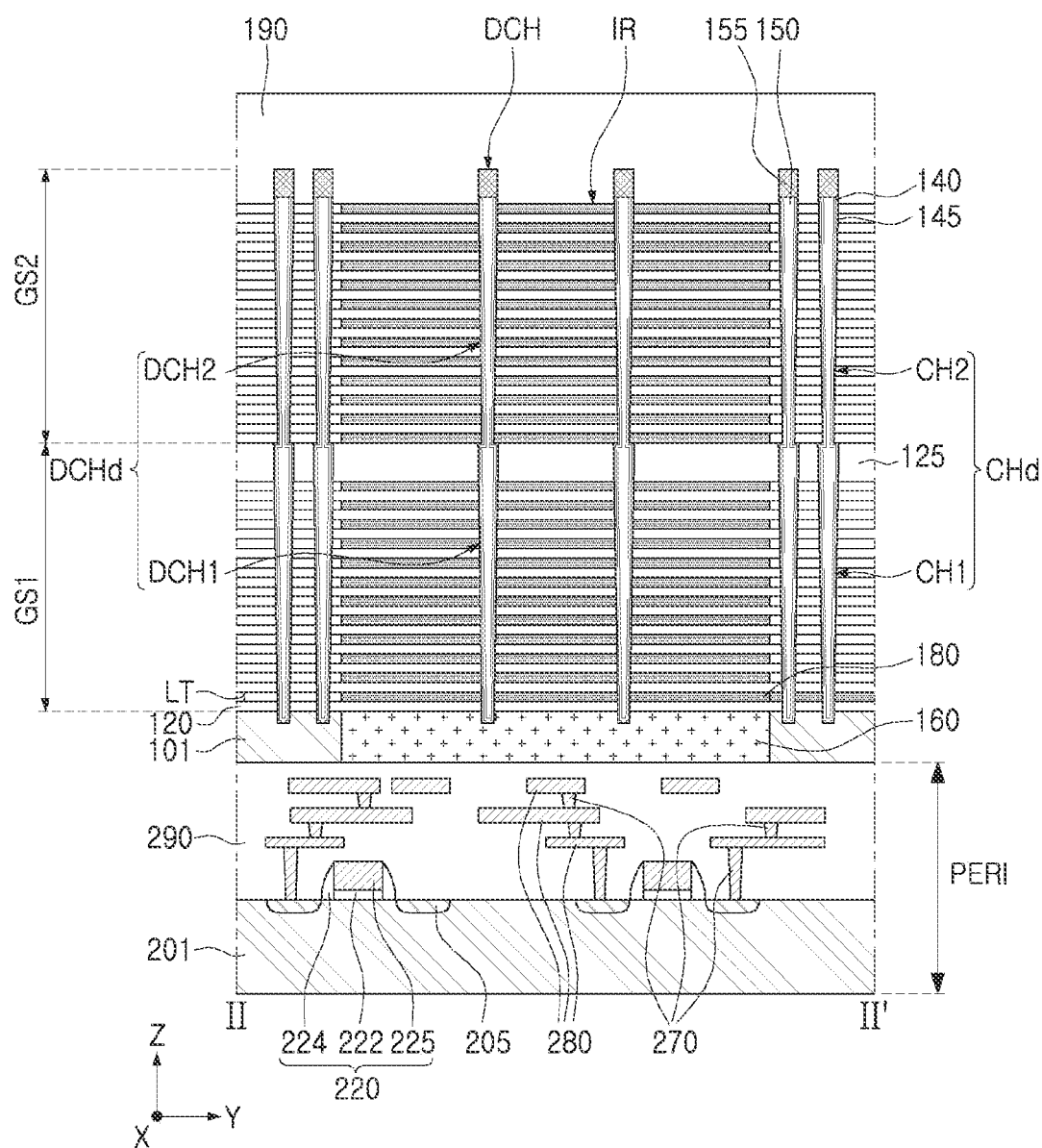

Referring to FIG. 14E, an opening (see FIG. 13C) may be formed to penetrate through the first and second stacked structures GS1 and GS2 in regions not illustrated in FIG. 14E, and the sacrificial insulating layers 180 may be partially removed through the opening.

First, a cell region insulating layer 190 may be formed. The opening may be formed in positions of the first and second separation regions MS1 and MS2 of FIG. 4. The sacrificial insulating layers 180 may be removed from the outside of an insulating region IR, for example, the outside region of the first and second through-wiring regions TB1 and TB2 (see FIG. 4). As a result, the insulating region IR of the first and second through-wiring regions TB1 and TB2 including the interlayer insulating layers 120, the sacrificial insulating layers 180, and the substrate insulating layer 160 may be defined.

Figure 14F:
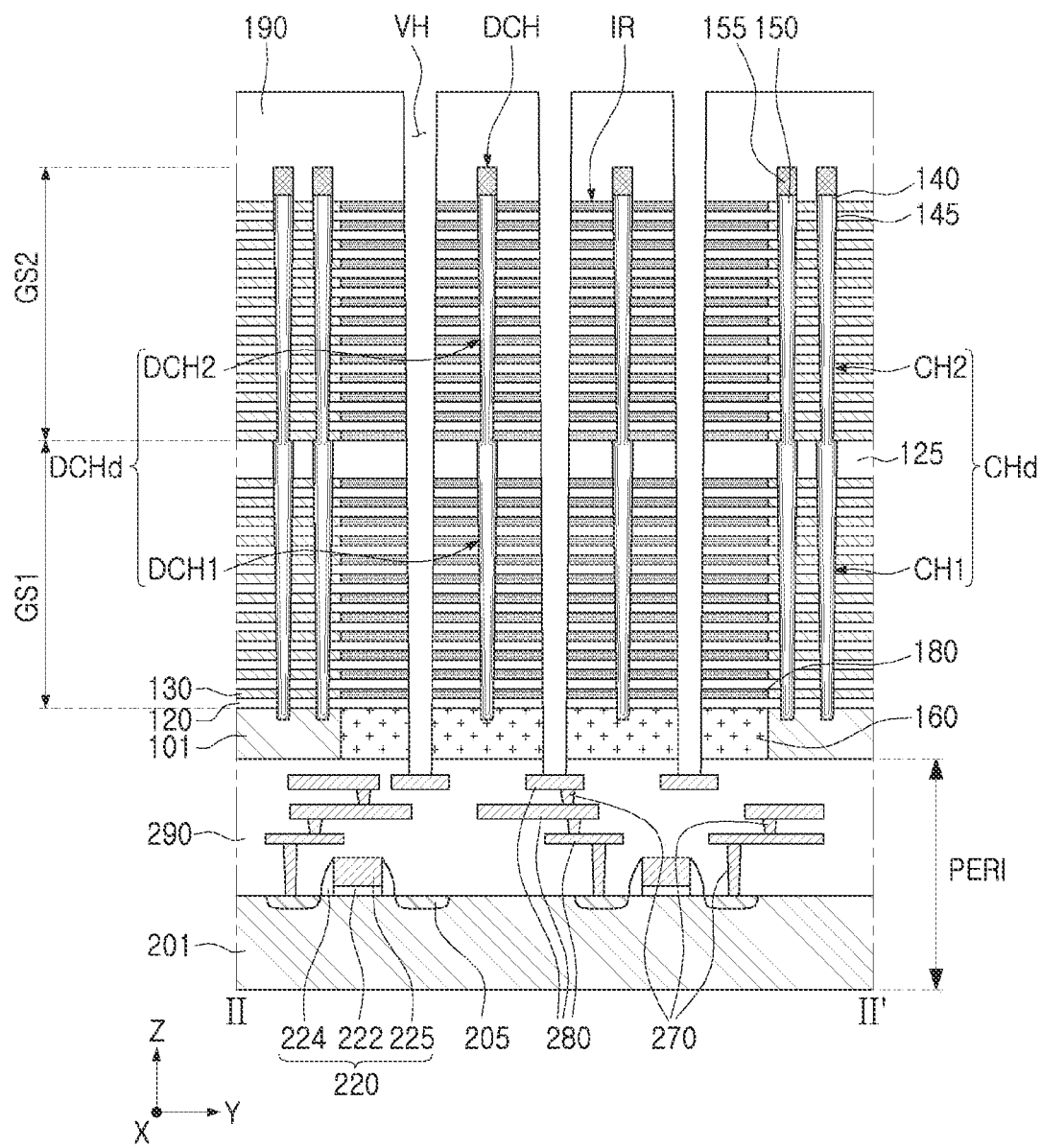

Referring to FIG. 14F, gate electrodes 130 may be formed by filling an area in which the sacrificial insulating layers 180 have been removed with a conductive material. The opening may be filled, and then contact holes VH for the formation of through-contact plugs 170 may be formed.

The opening may be filled with an insulating material or an insulating material and a conductive material. Before forming the contact holes VH, the cell region insulating layer 190 may be formed. Next, the contact holes VH penetrating through the cell region insulating layer 190 and the insulating region IR may be formed from the upper portion of the insulating region IR. A circuit wiring line 280 of the peripheral circuit region PERI may be exposed to lower ends of the contact holes VH.

Next, referring to FIG. 14F together with FIG. 11, the through-contact plugs 170 are formed by filling the contact holes VH with a conductive material, to form the first and second through-wiring regions TB1 and TB2, and the wiring line 175 connected to the upper ends of the through-contact plugs 170 may be formed, thereby manufacturing the semiconductor device 100d.

The manufacturing method described above with reference to FIGS. 14A to 14F is one example for manufacturing the semiconductor device 100d of FIG. 11, and the semiconductor device 100d may be manufactured by various manufacturing methods.

As set forth above, according to some example embodiments, regularly locating dummy channel structures in through-wiring regions may provide a semiconductor device with improved reliability.

While some example embodiments have been illustrated and described above, it will be apparent to those skilled in the art that modifications and variations could be made without departing from the scope of the present inventive concepts as defined by the appended claims.

What is claimed is:

1. A semiconductor device comprising:
   a peripheral circuit region including a first substrate and circuit devices on the first substrate;
   a memory cell region on the peripheral circuit region, wherein the memory cell region includes a second substrate, gate electrodes spaced apart from each other in a first direction that is perpendicular to an upper surface of the second substrate, and channel structures that penetrate the gate electrodes and extend vertically to the second substrate, and wherein the channel structures are connected to upper wiring structures; and
   a through-wiring region that electrically connects the memory cell region and the peripheral circuit region,
   wherein the through-wiring region includes:
   through-contact plugs that extend in the first direction to penetrate the memory cell region, wherein the through-contact plugs electrically connect the memory cell region and the circuit devices;
   an insulating region that surrounds the through-contact plugs, wherein the insulating region includes first insulating layers and second insulating layers that are alternately stacked; and
   dummy channel structures that penetrate the first insulating layers and the second insulating layers, wherein the dummy channel structures are not connected to the upper wiring structures.

2. The semiconductor device of claim 1, wherein a level of upper surfaces of the through-contact plugs is farther from the second substrate than a level of upper surfaces of the channel structures is from the second substrate.

3. The semiconductor device of claim 1, wherein a level of upper surfaces of the channel structures is substantially coplanar with a level of upper surfaces of the dummy channel structures.

4. The semiconductor device of claim 1, wherein the gate electrodes provide pad regions exposed upwardly, a lower gate electrode among the gate electrodes extending further than an upper gate electrode among the gate electrodes, and
 wherein the memory cell region further comprises pad channel structures that penetrate the gate electrodes in the pad regions and extend vertically to the second substrate, wherein the pad channel structures are not electrically connected to the upper wiring structures.

5. The semiconductor device of claim 1, wherein each of the channel structures has a diameter equal to or less than a diameter of each of the dummy channel structures.

6. The semiconductor device of claim 1, wherein at least one of the dummy channel structures comprises a structure that corresponds to a structure of the channel structures.

7. The semiconductor device of claim 6, wherein each of the channel structures and the dummy channel structures comprises a gate dielectric layer, a channel layer on the gate dielectric layer, and a channel insulating layer on the channel layer.

8. The semiconductor device of claim 1, wherein each of the dummy channel structures has a maximum diameter between about 70 nm to about 130 nm, and wherein each of the through-contact plugs has a maximum diameter between about 250 nm to about 350 nm.

9. The semiconductor device of claim 1, wherein each of the channel structures comprises a first channel structure and a second channel structure stacked in the first direction, and
 wherein each of the dummy channel structures comprises a first dummy channel structure and a second dummy channel structure overlying the first dummy channel structure in the first direction.

10. The semiconductor device of claim 9, wherein at least portions of the first dummy channel structures and the second dummy channel structures are spaced apart from each other in the first direction and are not directly connected to each other.

11. The semiconductor device of claim 9, wherein at least portions of the first dummy channel structures and the second dummy channel structures are shifted from each other in a second direction that is parallel to the upper surface of the second substrate.

12. The semiconductor device of claim 1, wherein the memory cell region further comprises interlayer insulating layers alternately arranged with the gate electrodes,
 wherein each first insulating layer and a respective interlayer insulating layer are equidistant from the second substrate, and
 wherein each second insulating layers and a respective gate electrode are equidistant from the second substrate.

13. A semiconductor device comprising:
 a first substrate;
 circuit devices on the first substrate;
 a second substrate on the circuit devices;
 gate electrodes spaced apart from each other in a first direction;
 channel structures that penetrate the gate electrodes and extend vertically to the second substrate;
 separation regions that extend in a second direction perpendicular to the first direction, wherein the separation regions extend through the gate electrodes and are spaced apart from each other and parallel to each other; and
 a through-wiring region located between adjacent separation regions and spaced apart from the adjacent separation regions,
 wherein the through-wiring region includes:
 through-contact plugs that electrically connect the circuit devices and the gate electrodes to each other or electrically connect the circuit devices and the channel structures to each other; and
 dummy channel structures that are spaced apart from the gate electrodes, such that the dummy channel structures do not contact a conductive layer.

14. The semiconductor device of claim 13, wherein the through-wiring region further includes an insulating region that includes first insulating layers and second insulating layers that are alternately stacked, and
 wherein the dummy channel structures penetrate the first insulating layers and the second insulating layers.

15. The semiconductor device of claim 13, wherein portions of the dummy channel structures are between a respective pair of the through-contact plugs adjacent to each other in at least one direction.

* * * * *